(12) United States Patent
Sekiguchi et al.

(10) Patent No.: US 7,603,592 B2
(45) Date of Patent: Oct. 13, 2009

(54) SEMICONDUCTOR DEVICE HAVING A SENSE AMPLIFIER ARRAY WITH ADJACENT ECC

(75) Inventors: Tomonori Sekiguchi, Tama (JP); Riichiro Takemura, Tokyo (JP); Satoru Akiyama, Kawasaki (JP); Satoru Hanzawa, Hachioji (JP); Kazuhiko Kajigaya, Iruma (JP)

(73) Assignees: Hitachi, Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/495,550

(22) Filed: Jul. 31, 2006

(65) Prior Publication Data

US 2007/0038919 A1    Feb. 15, 2007

(30) Foreign Application Priority Data

Aug. 1, 2005    (JP) ............................. 2005-223012

(51) Int. Cl.
   *G11C 29/00*    (2006.01)
(52) U.S. Cl. ................. 714/710; 714/758; 714/763; 365/201; 365/232
(58) Field of Classification Search ................ 714/763, 714/710, 752, 758; 365/201, 232
See application file for complete search history.

(56) References Cited

U.S. PATENT DOCUMENTS

| 5,056,095 | A | * | 10/1991 | Horiguchi et al. | ........... 714/765 |
|---|---|---|---|---|---|
| 5,313,425 | A | * | 5/1994 | Lee et al. | ..................... 365/201 |
| 5,604,703 | A | * | 2/1997 | Nagashima | ................. 365/200 |
| 5,914,907 | A | * | 6/1999 | Kobayashi et al. | ..... 365/230.03 |
| 6,728,149 | B2 | * | 4/2004 | Akamatsu | ................... 365/200 |
| 7,123,501 | B2 | * | 10/2006 | Noda | ......................... 365/145 |
| 2002/0018389 | A1 | * | 2/2002 | Ito et al. | ..................... 365/222 |
| 2003/0046632 | A1 |  | 3/2003 | Hatakenaka et al. | ........ 714/763 |

FOREIGN PATENT DOCUMENTS

JP    2003-77294    3/2003

* cited by examiner

*Primary Examiner*—Esaw T Abraham
(74) *Attorney, Agent, or Firm*—Miles & Stockbridge P.C.

(57) ABSTRACT

A semiconductor memory device capable of achieving a sufficient operating margin without increasing an area penalty even in the case of miniaturization is provided. An error correction system composed of a data bit of 64 bits and a check bit of 9 bits is introduced to a memory array such as DRAM, and an error correction code circuit required therein is disposed near a sense amplifier array. In addition to normal memory arrays composed of such memory arrays, a redundant memory array having a sense amplifier array and an error correction code circuit adjacent thereto is provided in a chip. By this means, the error which occurs in the manufacture can be replaced. Also, the error correction code circuit corrects the error at the time of an activate command and stores the check bit at the time of a pre-charge command.

14 Claims, 20 Drawing Sheets

$$H = \begin{pmatrix} h0 & h8 & h7 & h6 & h5 & h4 & h3 & h2 \\ h1 & h0 & h8 & h7 & h6 & h5 & h4 & h3 \\ h2 & h1 & h0 & h8 & h7 & h6 & h5 & h4 \\ h3 & h2 & h1 & h0 & h8 & h7 & h6 & h5 \\ h4 & h3 & h2 & h1 & h0 & h8 & h7 & h6 \\ h5 & h4 & h3 & h2 & h1 & h0 & h8 & h7 \\ h6 & h5 & h4 & h3 & h2 & h1 & h0 & h8 \\ h7 & h6 & h5 & h4 & h3 & h2 & h1 & h0 \\ h8 & h7 & h6 & h5 & h4 & h3 & h2 & h1 \end{pmatrix}$$

SUBMATRIX (8 COLUMNS × 9 ROWS)

AS0= 'H', AS1-3= 'L', RN0-3= 'L'

AS1= 'H', AS0,2,3= 'L', RN0-2= 'L', RN3= 'H'

SEMICONDUCTOR DEVICE HAVING A SENSE AMPLIFIER ARRAY WITH ADJACENT ECC

CROSS-REFERENCE TO RELATED APPLICATION

The present application claims priority from Japanese Patent Application No. JP 2005-223012 filed on Aug. 1, 2005, the content of which is hereby incorporated by reference into this application.

TECHNICAL FIELD OF THE INVENTION

The present invention relates to a semiconductor memory device. More particularly, it relates to a semiconductor memory such as a dynamic random access memory (DRAM) mounted with an error correction code circuit.

BACKGROUND OF THE INVENTION

According to the study by the inventors of the present invention, the following technologies for improving the reliability of the DRAM are known.

For example, Japanese Patent Application Laid-Open Publication No. 2003-77294 (Patent Document 1) describes a memory circuit as shown in FIG. 21. The memory circuit shown in FIG. 21 has a structure in which the data from memory cells of SRAM or DRAM is checked and corrected in the error correction code circuits (ECC circuit). If the structure as described above is used, even when error occurs in the data bit of 4 bits, the error can be corrected by using the check bit of 3 bits.

Further, a plurality of ECC circuits are provided to a memory array and the data from the bit lines not adjacent to each other are connected to each ECC circuit in FIG. 21, and the error correction is performed in this structure. Therefore, even when the so-called multi-bit soft error occurs in a plurality of consecutive bit lines, the error correction can be performed. Also, redundant memory cells are provided in order to replace the stuck failure, and the data from the normal memory cell and the data from the redundant memory cell can be replaced in the course of connection from the sense amplifier circuit to the ECC circuits.

SUMMARY OF THE INVENTION

Incidentally, according to the sturdy for the technology for improving the reliability of the DRAM by the inventors of the present invention, the following facts have been revealed.

Capacitors and miniaturized transistors capable of achieving a large capacitance in a limited bottom area of a memory cell are required in order to achieve the miniaturization and the high integration density of the DRAM memory cell. However, when the memory cell transistors are miniaturized, the variation in devices is significantly increased, and the operating margin of the DRAM is degraded due to the variation and the influence of the voltage reduction in combination.

In particular, the mismatch in threshold voltage of MOS transistors which form the sense amplifier and the reduction in the voltage at the storage node due to the junction leakage current cause serious problems. Further scaling leads to the increase of mismatch in threshold voltage because the number of impurities in the channel of the miniaturized MOS transistor significantly fluctuates. Further, the junction leakage current is also increased because the electric field in the diffusion layer becomes stronger due to the miniaturization.

Due to the device variations as described above, the effective amplitude of signals at the time when the data is read from the memory cell is reduced, and the risk that the data is erroneously read out when the signals are amplified by the sense amplifier is increased.

Accordingly, in order to improve the operating margin of the DRAM as described above, the technology of the above-described Patent Document 1 is considered. However, since the check bit of 3 bits is provided for the data bit of 4 bits in the technology of the Patent Document 1, the area of the memory cell is increased by 75% in comparison to the case where the error correction by the ECC circuits is not used. The DRAM chip with such a large area penalty is difficult to apply to cost-conscious products such as a server, a personal computer (PC) and electric appliances. Therefore, it is desired that the ECC system in which a check bit of about 8 bits is provided for a data bit of 64 bits is used for the DRAM so that the area penalty of the memory cell is suppressed to about 10% to reduce the increase in chip area and cost.

Meanwhile, in order to operate the ECC circuits with using a large number of bits as described above, it is necessary to bring a large number of bits from the sense amplifier to the ECC circuits. In such a case, the power consumption and the wiring delay which occur in this wiring are increased to an unacceptable level. Therefore, it is desired that the ECC circuits are disposed near the sense amplifier circuit so as to reduce the power consumption and the wiring delay.

In the technology of the Patent Document 1, however, it is expected that the ECC circuit is practically difficult to be disposed near the sense amplifier circuit. One of the factors thereof is that, since the ECC system in which the check bit of 3 bits is provided for the data bit of 4 bits is used in the technology of the Patent Document 1, the area of the ECC circuit is increased. Accordingly, when such a structure is applied to DRAM and the ECC circuit and the sense amplifier are disposed close to each other, the area of the so-called direct peripheral circuits is increased, and as a result, the chip area is undesirably increased.

Another factor thereof is that, though the ECC circuits are provided for the normal memory cells as shown in FIG. 21 in the technology of the Patent Document 1, the ECC circuit is not provided for the redundant memory cells. In such a case, when the data of the normal memory cell is to be substituted for the data of the redundant memory cell, the switching of the paths has to be performed by disposing a multiplexer or the like on the path from the sense amplifier circuit to the ECC circuits.

Therefore, an area for disposing the multiplexer has to be provided on the layout between the sense amplifier and the ECC circuit, and in this case, the sense amplifier and the ECC circuit cannot be disposed close to each other. Also, since a plurality of sense amplifier circuits are separately disposed in a chip in DRAM, if the multiplexer is disposed as described above, the area of the direct peripheral circuits including the wiring area thereof is significantly increased. Consequently, it is difficult to dispose the sense amplifier circuit and the ECC circuit close to each other. Furthermore, the delay time due to the multiplexer and the wiring thereof causes the degradation of the operation speed.

The present invention has been made in the light of the problems as described above. The above and other objects and novel characteristics of the present invention will be apparent from the description of this specification and the accompanying drawings.

The typical ones of the inventions disclosed in this application will be briefly described as follows.

The semiconductor memory device according to the present invention comprises: a plurality of memory arrays each having a plurality of word lines, a plurality of bit lines, and a plurality of memory cells; and sense amplifier arrays disposed so as to correspond to the memory arrays, wherein error correction code circuits are disposed near the sense amplifier arrays. Also, the error correction code circuit performs the error correction of the data read to each sense amplifier in the sense amplifier array. Such a structure is suitable for the system in which the error correction is performed when an activate command is inputted. Further, since the sense amplifier array and the error correction code circuit are disposed close to each other, the power consumption required for the charge and discharge in the wiring therebetween can be reduced. In addition, the penalty of the operation speed due to the delay time of the wiring can be also reduced. Still further, since the integration density can be increased because they are closely disposed, the area penalty can be reduced.

Incidentally, in addition to the system in which the error correction is performed in a cycle of the activate command (row command), the system in which the error correction is performed in accordance with a column command is also available. In such a system of the column command, the error correction code circuit can be disposed in the so-called indirect peripheral circuits. Therefore, the area penalty can be reduced in comparison to the system of the row command. However, although the system of the row command is based on the cycle of several tens ns, the system of the column command is based on the cycle of about several ns. Therefore, the penalty given to the operation cycle of the entire chip is very large. Accordingly, the operation cycle penalty and the area penalty can be efficiently reduced when the system of the row command is applied and then the sense amplifier array and the error correction code circuits are disposed close to each other.

Also, the semiconductor memory device according to the present invention comprises: a redundant memory array included in the plurality of memory arrays, wherein the error correction code circuit is disposed near the sense amplifier array of the redundant memory array. By this means, the yield and reliability of the chip can be improved from both of the failure replacement by means of the error correction code circuits and the failure replacement by means of the redundant substitution. Furthermore, since the error correction code circuit for use only by the redundant memory array is provided, the path switching circuit or the like between the sense amplifier and the error correction code circuit, which is required when the exclusive error correction code circuit is not provided and the error correction code circuit of the normal memory array is used in common, is unnecessary. Consequently, it becomes possible to readily dispose the error correction code circuits near the sense amplifier array.

Note that, since the redundant memory array has an exclusive error correction code circuit, it is desired that the redundant substitution of the redundant memory array and the normal memory array is performed in units of memory array. Also, in this substitution in units of memory array, it is preferable to employ the system in which the connection destination of the input/output buffer is selected from the I/O line connected to the normal memory array and the I/O line connected to the redundant memory array by a multiplexer.

More specifically, the error correction code circuit described above can be formed from a plurality of sub-circuits disposed close to the respective sense amplifier circuits in a one-to-one manner. Also, the plurality of sub-circuits described above can be categorized into a plurality of first sub-circuits and a plurality of second sub-circuits. In this case, the first sub-circuit corresponds to each sense amplifier of the data bit, and it has a function to generate a check bit based on the data read to the sense amplifier and correct the data read to the sense amplifier when an error is present in the data. On the other hand, the second sub-circuit corresponds to each sense amplifier of the check bit, and it has a function to compare and check a value of the check bit generated in the first sub-circuit and a value of the check bit generated and stored in advance and transmit the result of the comparison showing the presence/absence of the error to the first sub-circuit. With such a circuit structure, the sense amplifier array can be disposed near the error correction code circuits in an efficient layout.

The effects obtained by typical aspects of the present invention will be briefly described below. That is, it is possible to efficiently reduce the area penalty and the operation cycle penalty caused by providing an error correction code circuit in a semiconductor memory device.

BRIEF DESCRIPTIONS OF THE DRAWINGS

DESCRIPTIONS OF THE PREFERRED EMBODIMENTS

Figure 1A:
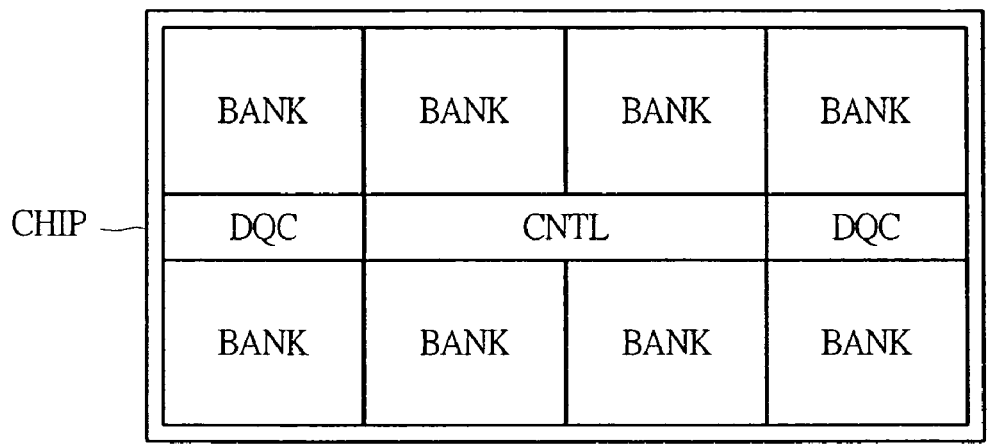
FIG. 1A is a plan view showing an example of the structure of an entire chip in a semiconductor memory device according to an embodiment of the present invention.

Hereinafter, embodiments of the present invention will be described in detail with reference to the accompanying drawings. Note that components having the same function are denoted by the same reference symbols throughout the drawings for describing the embodiment, and the repetitive description thereof will be omitted. Also, in the drawings, an arrow mark is attached to a gate of the PMOS transistor so as to distinguish it from the NMOS transistor. Furthermore, though the connection of the substrate potential of the MOS transistors is not particularly described in the drawings, any connection method can be employed as long as MOS transistors can be normally operated.

Figure 1B:
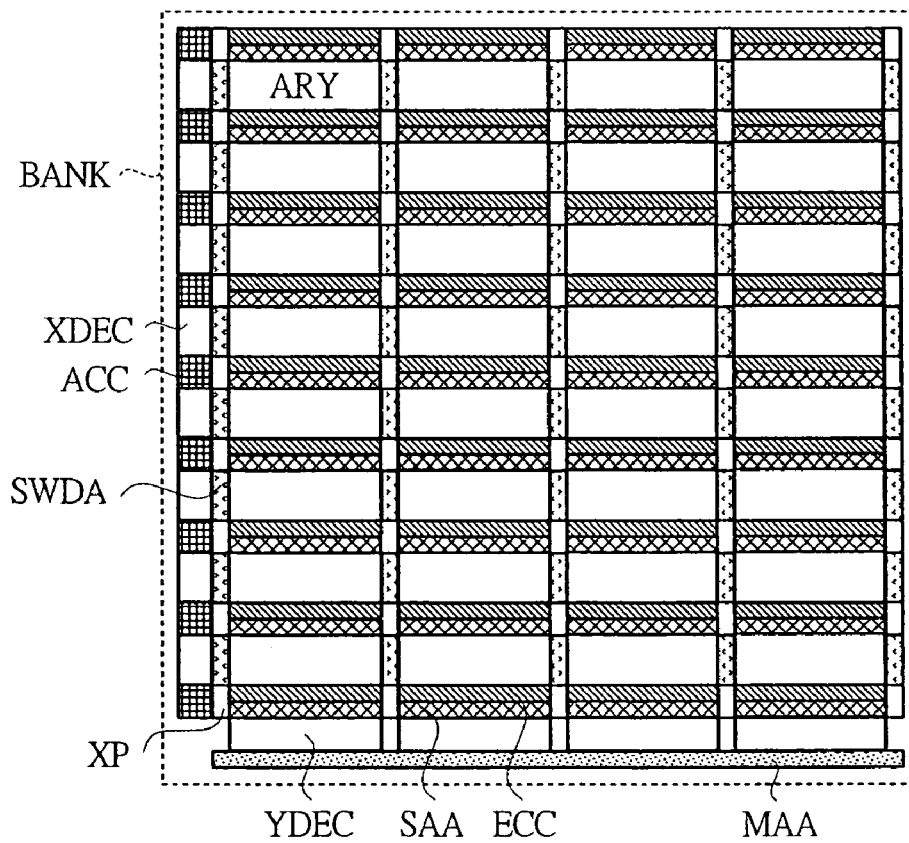
FIG. 1B is a plan view showing an example of the structure of a memory bank in FIG. 1A in a semiconductor memory device according to an embodiment of the present invention.

FIG. 1 is a plan view showing an example of a chip structure in a semiconductor memory device according to an embodiment of the present invention, in which FIG. 1A shows an example of the structure of the entire chip, and FIG. 1B shows an example of the structure of a memory bank in FIG. 1A.

The semiconductor memory device shown in FIG. 1 is a DRAM. The entire structure of the memory chip CHIP thereof is roughly divided into, for example, a control circuit CNTL, input/output circuits DQC, and memory banks BANK as shown in FIG. 1A. Clock, address, and control signals are inputted from the outside of the memory chip CHIP to the control circuit CNTL, in which the operation mode of the memory chip CHIP is determined and predecoding of the address or the like is performed. The input/output circuit DQC has an input/output buffer and others, to which a write data is inputted from the outside of the memory chip CHIP and from which a read data is outputted to the outside of the memory chip CHIP.

In the memory bank BANK, for example, a plurality of memory arrays ARY are disposed in an array of rows and columns as shown in FIG. 1B, and a sense amplifier array SAA, a sub-word driver array SWDA, an error correction code circuit ECC, and a cross area XP are disposed around each of the memory array ARY. In addition, in the periphery of the memory bank BANK, column decoders YDEC and a main amplifier array MAA are disposed in parallel to the sense amplifier array SAA and row decoders XDEC and array control circuits ACC are disposed in parallel to the sub-word driver array SWDA.

Figure 2A:
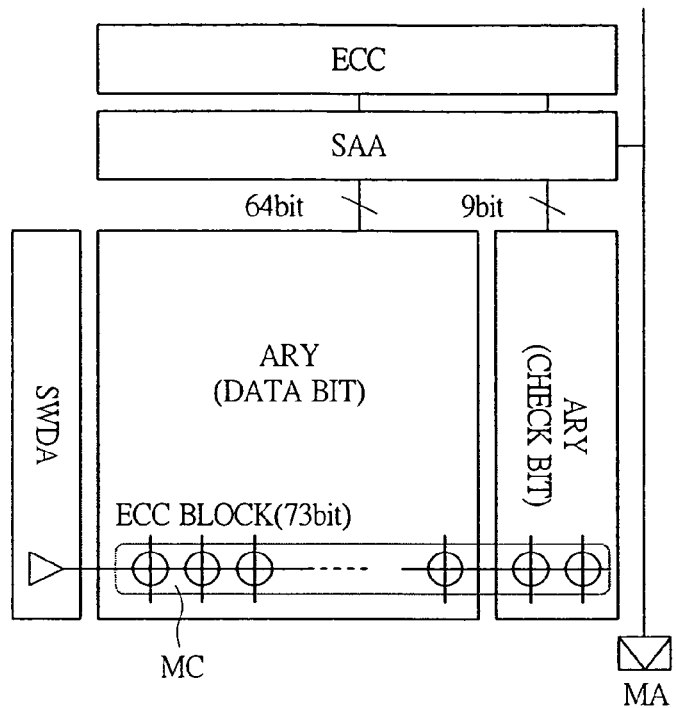
FIG. 2A is a schematic diagram showing an example of the structure around a memory array including a error correction code circuit in the semiconductor memory device shown in FIG. 1.
Figure 2B:
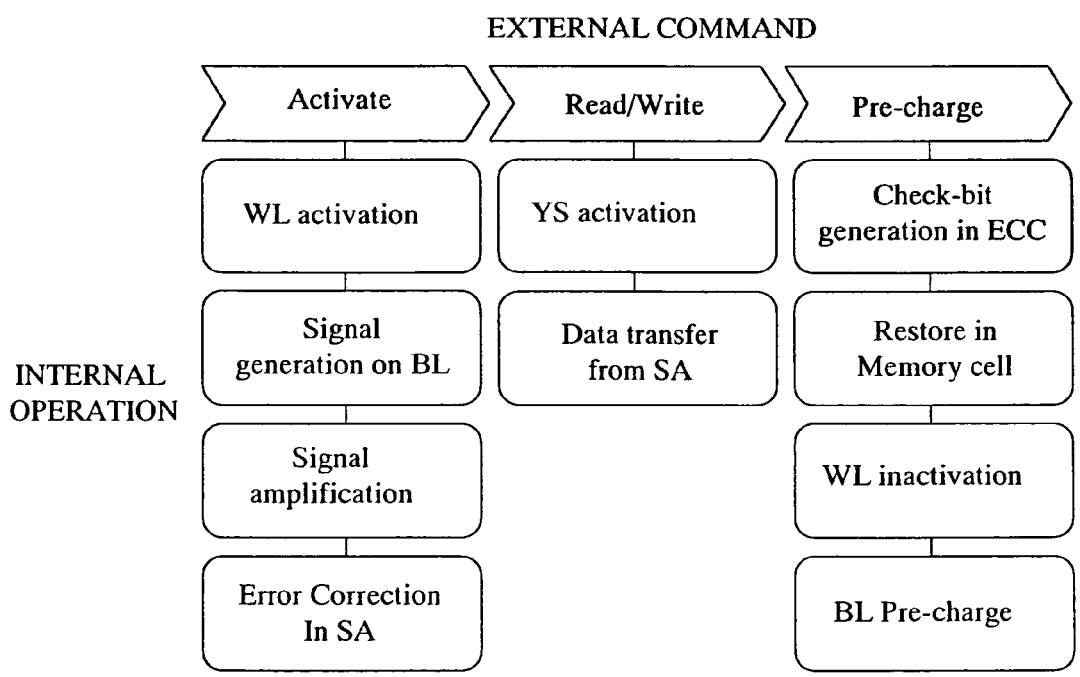
FIG. 2B is a sequence diagram showing an operation example of the structure in FIG. 2B in the semiconductor memory device shown in FIG. 1.

FIG. 2 shows a structure around the memory array and the operation of the memory array in the semiconductor memory device shown in FIG. 1, in which FIG. 2A is a schematic diagram showing an example of the structure around the memory array including the error correction code circuit and FIG. 2B is a sequence diagram for explaining the operation example in FIG. 2A. In the semiconductor memory device shown in FIG. 2A, an error correction code circuit ECC is mounted to the sense amplifier array SAA disposed near the memory array ARY in a one-to-one manner. In this case, ECC is a circuit having an error correction ability of 1 bit.

Note that the sense amplifier array SAA is also called a direct peripheral circuit in general, and the error correction code circuit ECC provided for the sense amplifier array SAA also belongs to the direct peripheral circuit. Meanwhile, address circuits such as XDEC and YDEC and data circuits which belong to the outer terminal side of the chip than MAA are called indirect peripheral circuits in general.

The memory array ARY is divided into an array for data bit (DATA BIT) and an array for check bit (CHECK ARRAY), and one ECC block (ECC BLOCK) is formed from a data bit of 64 bits and a check bit of 9 bits. In this structure, through one array operation, the whole ECC block is read to the sense amplifier array SAA and the error check and correction are performed in the error correction code circuit ECC. Since the error correction is performed by the ECC, the chip operating margin can be increased even when the memory cell is miniaturized and the device variation is increased. Also, since the check bit has only 9 bits for a large number of bits of 64 bits, the area penalty of the memory cell or the like can be reduced.

Next, an example of the operation of the semiconductor memory device will be described with reference to FIG. 2B. The operation in the chip after the activate command, that after the read/write command, and that after the pre-charge command are shown in FIG. 2B. The feature of this operation example lies in that the error correction code circuit ECC is operated after the activate command and the pre-charge command.

As the flow of the external command, the bank is first activated by the activate command and the data is exchanged with the bank by the read/write command. Thereafter, the bank is inactivated by the pre-charge command. In response to this flow, in the chip, the word line is activated by the activate command and a signal is read out to the bit line. Subsequently, after amplifying the read signal in the sense amplifier, the error check and correction of the data in the sense amplifier are performed in the ECC. At this time, when the read/write command is inputted, the column selection line is activated to read the error-corrected data from the sense amplifier or to write a new data in the sense amplifier. Then, when the pre-charge command is inputted, the check bit is generated in ECC and the generated check bit is written into the memory cell for the check bit. Thereafter, the word line is inactivated to pre-charge the bit line.

As described above, in the structure and operation in FIG. 2, the ECC is provided for the sense amplifier and the error correction is performed when the activate command is inputted. Since the cycle of the activate operation is about 60 ns, the penalty given to the operation cycle due to the delay of several ns generated in the error correction code circuit ECC can be advantageously reduced. Therefore, the timing specifications equivalent to those of the DRAM which is not provided with the error correction code circuit can be achieved. Meanwhile, in the case where the ECC is disposed in the indirect peripheral circuits and the error correction is performed at the time of read/write operation like in the conventional technology, since the penalty of several ns is added to the operation cycle of about 5 ns, the operation speed is largely reduced.

Figure 3:
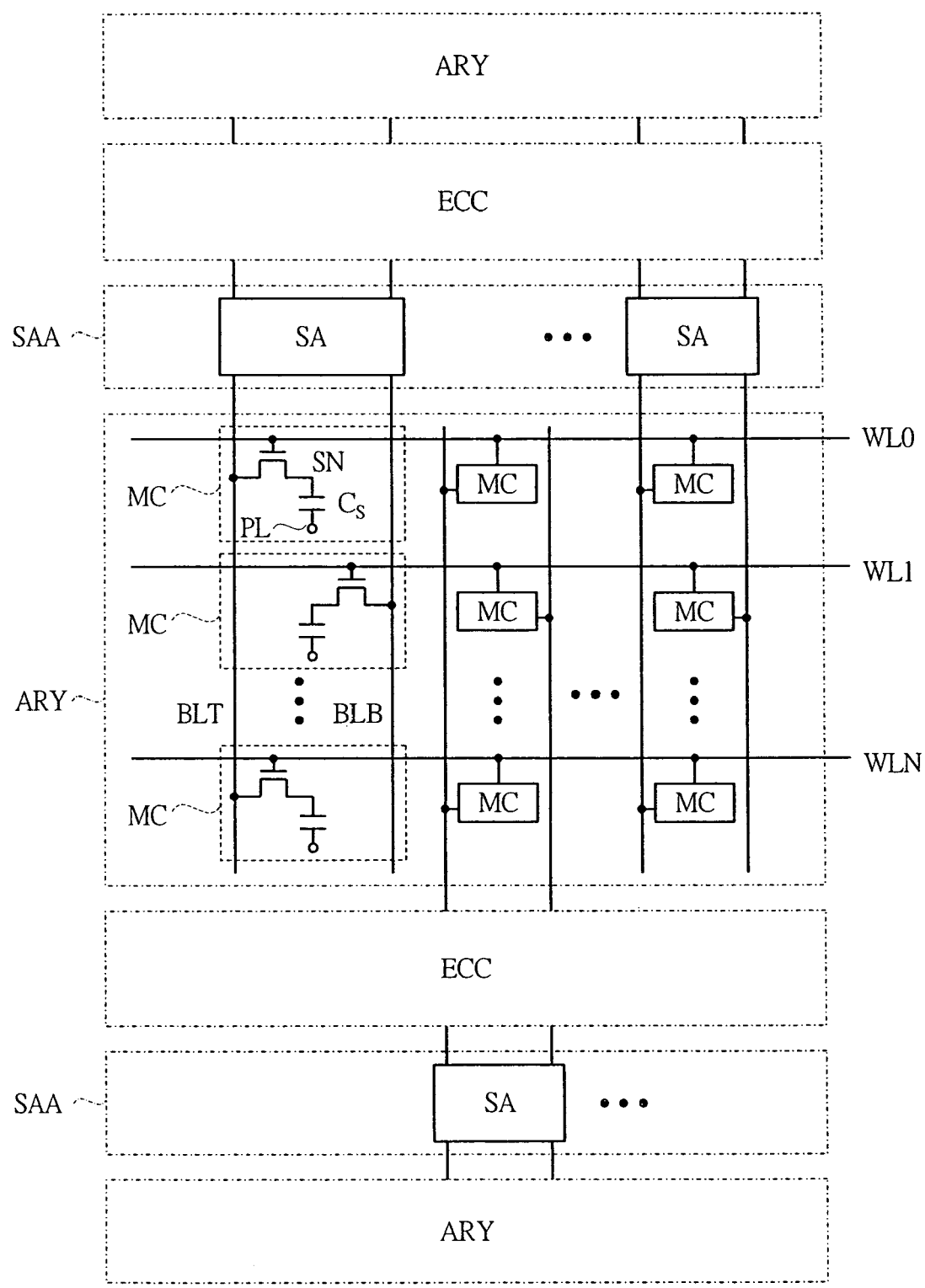
FIG. 3 is a circuit diagram showing an example of the structure of the memory array in the semiconductor memory device shown in FIG. 1.

FIG. 3 is a circuit diagram showing an example of the structure of the memory array in the semiconductor memory device shown in FIG. 1. As shown in FIG. 3, the memory array ARY is composed of a plurality of memory cells MC. Each memory cell MC is a DRAM memory cell and is composed of one MOS transistor (memory cell transistor) and one capacitor Cs. One of the source and drain of the memory call transistor is connected to a bit line BLT or a bit line BLB, and the other of the source and drain of the memory cell transistor is connected to a storage node SN. Also, a gate thereof is connected to a word line WL.

One terminal of the capacitor Cs is connected to the storage node SN, and the other terminal thereof is connected to a common plate PL. Note that the bit lines BLT and BLB function as a bit line pair (complementary bit lines) and are connected to the same sense amplifier SA. The sense amplifier array SAA and the error correction code circuit ECC are alternately disposed above and below the memory array ARY, and they are connected to the bit line pair BLT/BLB in the upper and lower memory arrays ARY and are used in common. Accordingly, in each of the sense amplifier arrays SAA, the adjacent sense amplifiers SA are disposed at an interval equal to the space of one bit line pair.

In the structure as described above, since the pitch between sense amplifiers SA is loosen, the sense amplifiers can be readily laid out and the miniaturization can be achieved. Also, though described later in detail with reference to FIG. 8 and others, the pitch between ECC sub-circuits can be similarly loosen when the ECC sub-circuits are disposed so as to correspond to each SA in a one-to-one manner. Therefore, the layout is facilitated and the miniaturization can be achieved. Also, since the ECC is disposed near the SA, the wiring between them is short and the charge-discharge power consumption of the wiring is small. On the other hand, in the case of using the ECC system in which ECC is disposed in the indirect peripheral circuits and the check bit is provided for such a large number of bits, a large number of long distance wirings have to be disposed on the chip. Therefore, the power consumption is increased.

Figure 4:
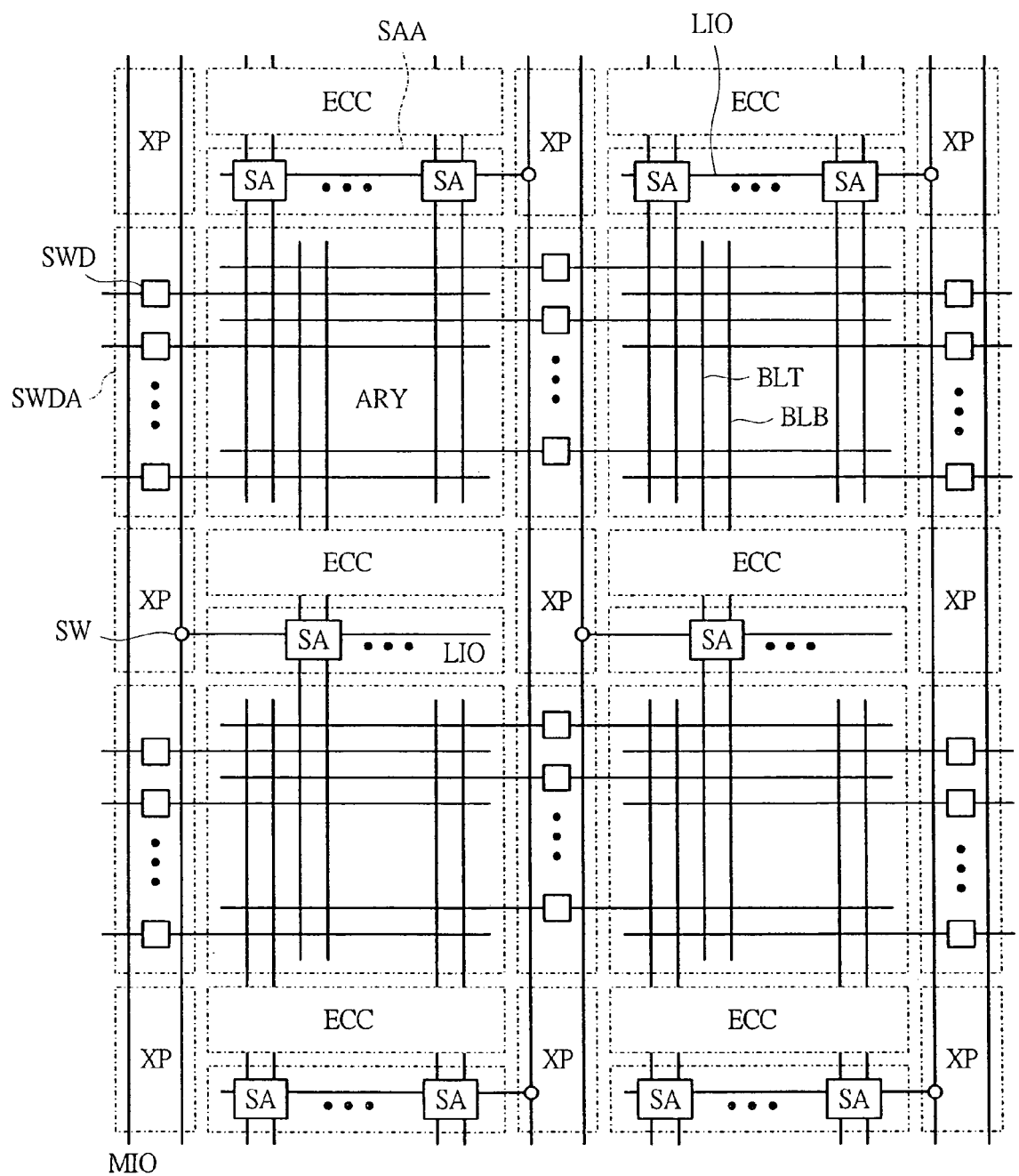
FIG. 4 is a plan view showing an example of the detailed relation in the layout of the sense amplifier array, the sub-word driver array, and the error correction code circuit in the semiconductor memory device shown in FIG. 1.

FIG. 4 is a plan view showing an example of the detailed relation in the layout of the sense amplifier array, the sub-word driver array, and the error correction code circuit in the semiconductor memory device shown in FIG. 1. As shown in FIG. 4, the sense amplifiers SA of the sense amplifier array SAA and the error correction code circuit ECC are alternately disposed above and below the memory array ARY and are connected in common to the bit line pairs BLT/BLB of the upper and lower memory arrays ARY.

Similarly, the sub-word drivers SWD in the sub-word driver array SWDA are alternately disposed on the right and left of the memory array ARY and are connected in common to the word lines WL in the right and left memory arrays ARY. In such a structure, the pitch between the sub-word drivers SWD in the sub-word driver array SWDA can be expanded to twice the pitch between the word lines WL in the memory array ARY. Accordingly, the miniaturization can be facilitated.

Also, in the sense amplifier array SAA, a local I/O line LIO is disposed, and LIO is connected to a main I/O line MIO through a switch SW in the cross area XP. In the read operation, the data in the sense amplifier SA, the error of which is corrected by using ECC, is read to the outside of the chip via LIO and MIO, and in the write operation, data is written to the sense amplifier SA from the outside of the chip via MIO and LIO.

Figure 5:
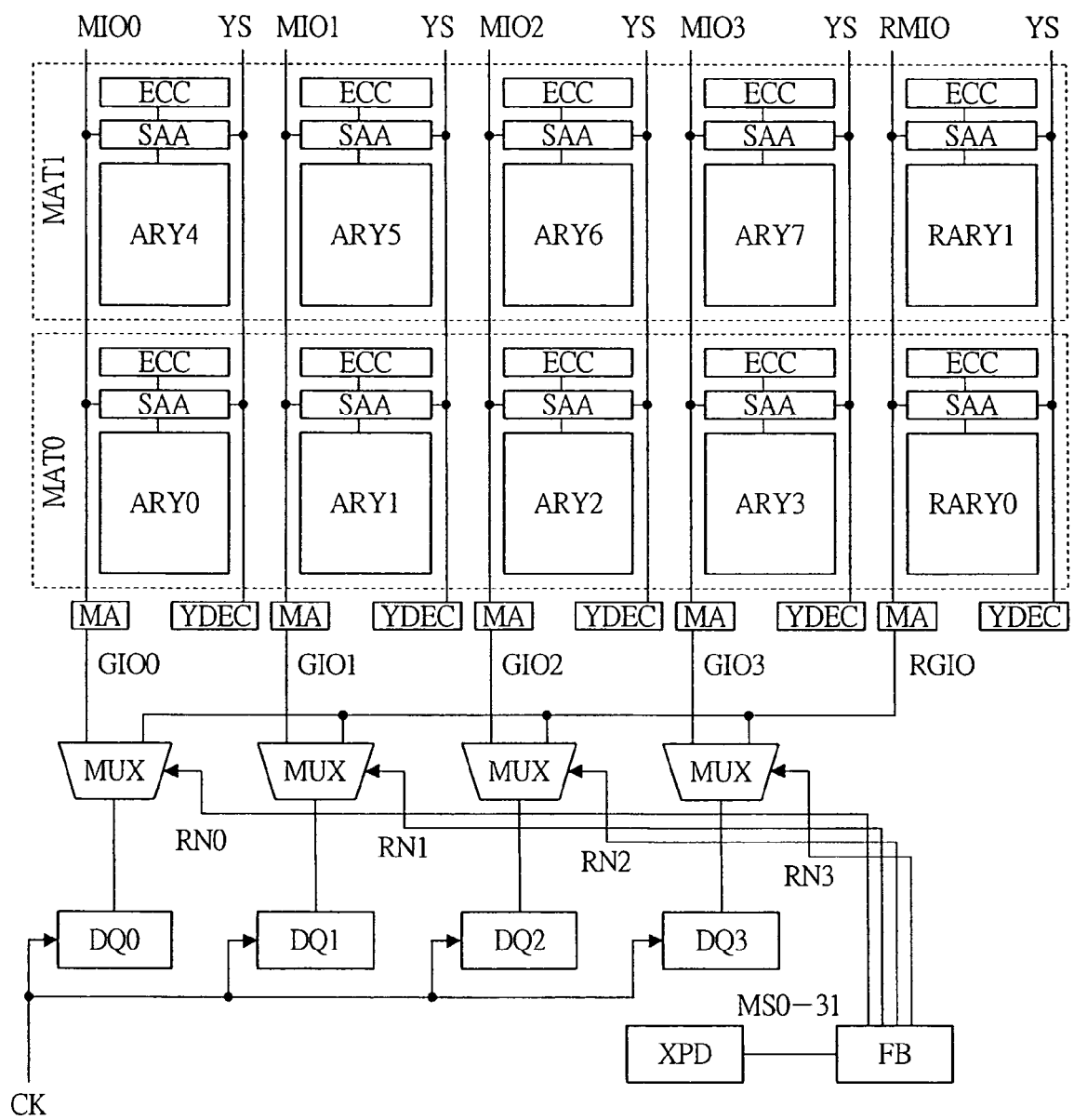
FIG. 5 is a block diagram showing an example of the structure having a redundant area in the memory bank in the semiconductor memory device shown in FIG. 1.

FIG. 5 is a block diagram showing an example of the structure having a redundant area in the memory bank in the semiconductor memory device shown in FIG. 1. Although several tens memory mats MAT are included in the memory bank BANK in general, the case where two memory mats MAT of MAT0 and MAT1 are disposed is shown in FIG. 5 for the simplification of the description. The normal memory arrays ARY0 to ARY7 and the redundant memory arrays RARY0 and RARY1 have the corresponding sense amplifier array SAA and error correction code circuit ECC. However, for the simplification of the description, they do not have the structure in which the sense amplifier array SAA is connected in common to the memory arrays ARY as shown in FIG. 4. Also, in FIG. 5, ARY0 to ARY3 and RARY0 belong to the memory mat MAT0 and ARY4 to ARY7 and RARY1 belong to the memory mat MAT1.

In such a structure, for example, when a manufacturing failure which cannot be replaced by ECC occurs in a memory array ARY in a certain memory mat MAT, the failure can be replaced by substituting the entire corresponding array ARY for the redundant memory array ARY in the same memory mat MAT. Furthermore, since the redundant memory array RARY is provided separately from the normal memory arrays ARY and the independent error correction code circuit ECC is provided for the sense amplifier array SAA of the redundant memory array RARY, the multiplexer between the redundant sense amplifier and ECC which is required in the conventional technology can be eliminated. Accordingly, it is possible to achieve the reduction in circuit area and wiring area.

Note that the error correction code circuit ECC in FIG. 5 can correct an error if the error is present in 1 bit of 64 bits. However, it cannot correct the error if the error is present in several bits. Also, in the error correction method according to this embodiment, ECC and SAA correspond to each other in a one-to-one manner, and the wiring pattern of the ECC portions differs for each SA in SAA. Therefore, the substitution in units of sense amplifier, that is, the normal sense amplifier connected to a failure bit is substituted for the redundant sense amplifier, cannot be readily performed. Accordingly, when the error correction cannot be performed by using ECC, the substitution in units of memory array in which the error correction is required is performed. By this means, the redundant replacement can be performed while utilizing the error correction. Also, since the redundant memory array is prepared to perform the replacement, the defect which occurs in the manufacture of the products can be replaced, and the yield of the chip can be improved.

As described above, since the redundant replacement is performed in units of memory array corresponding to ECC, a multiplexer MUX is disposed in a former stage of the input/output buffer DQ and an I/O line connected to the normal memory array ARY and an I/O line connected to the redundant memory array RARY are connected to the multiplexer MUX in the structure example in FIG. 5. When DRAM receives the activate command, the word line in one memory mat (for example, MAT0) is selected, and data is read to the sense amplifier array SAA from all memory arrays (for example, ARY0 to ARY3 and RARY0) in the memory mat. In the normal memory arrays (for example, ARY0 to ARY3), the data read to SAA is selected by the column selection line YS outputted from the column decoder YDEC and then read to the main I/O lines MIO0 to MIO3. Also in the redundant memory array (for example, RARY0), the data is read to the redundant main I/O line RMIO.

The data read to MIO0 to MIO3 and RMIO is amplified by the main amplifier MA and then outputted to the normal global I/O lines GIO0 to GIO3 and the redundant global I/O line RGIO. In this case, when stuck failure does not occur in ARY0 to ARY3 and the redundant replacement is not performed, the data on GIO0 to GIO3 passes through the multiplexer MUX and is directly outputted to the outside of the chip by the input/output buffers DQ0 to DQ3. Meanwhile, when the redundant replacement is performed, any of the redundancy selection lines RN0 to RN3 is activated, and the data of any of the GIO0 to GIO3 is substituted for the data of RGIO through MUX. Also, the number of the memory array ARY to be replaced in each memory mat MAT is programmed in the fuse block FB in advance.

When the activate command is inputted to DRAM, the mat selection signals MS0 to MS31 corresponding to the memory mats MAT0 to MAT31 are inputted to FB from the row address predecoder XPD. Then, the memory array to be replaced in the memory mat corresponding to the inputted selection signal is determined based on the fuse information in FB, and the redundancy selection signal RN corresponding to the memory array is activated. By this means, for example, ARY0 can be replaced with RARY0 in MAT0 and ARY6 can be replaced with RARY1 in MAT1. Note that, in this case, the case of the redundant replacement which is performed in the read operation from the memory array has been described. However, the redundant replacement is of course performed also in the write operation to the memory array in the same manner.

Figure 6A:
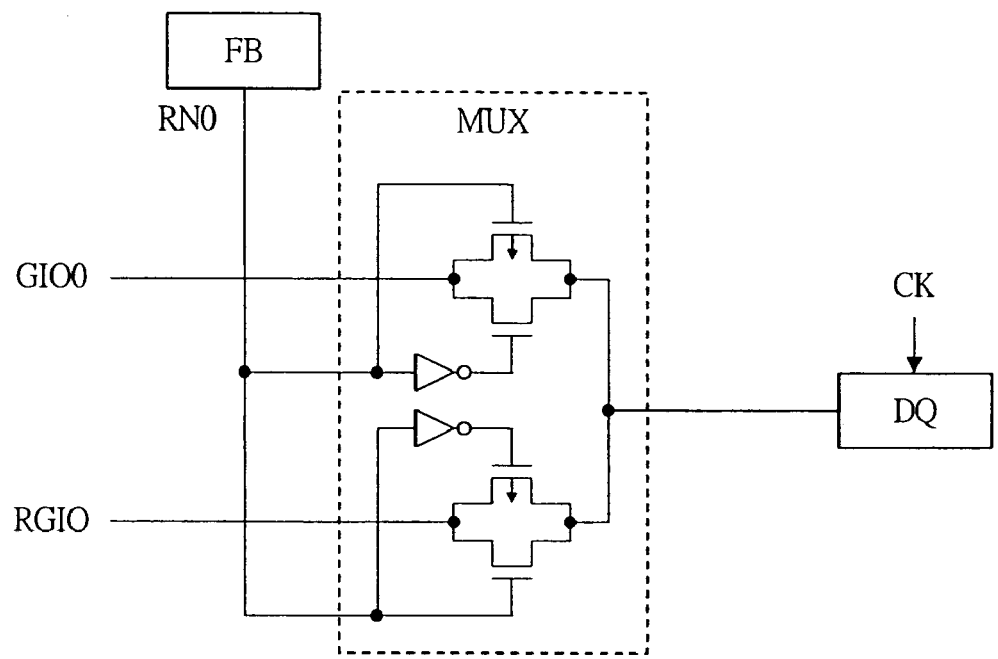
FIG. 6A is a diagram showing an example of the circuit structure of the multiplexer in the structure in FIG. 5.
Figure 6B:
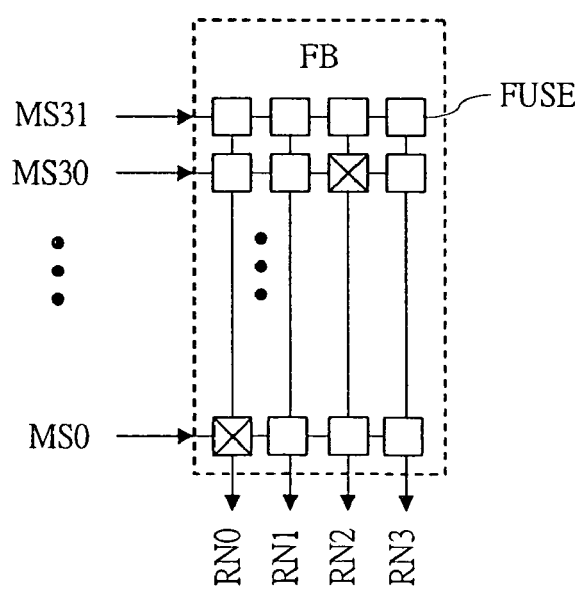
FIG. 6B is a diagram showing an example of the circuit structure of the fuse block in the structure in FIG. 5.

FIG. 6 is a diagram showing a detail of the internal circuits in the structure in FIG. 5, in which FIG. 6A is a diagram showing an example of the circuit structure of the multiplexer and FIG. 6B is a diagram showing an example of the circuit structure of the fuse block. As shown in FIG. 6A, the multiplexer MUX is composed of pass transistors and is disposed so as to correspond to the input/output buffer DQ. When the redundancy selection signal (for example, RN0) outputted from the fuse block FB is in an activated state, the redundant global I/O line (for example, RGIO) is connected to the input/output buffer DQ, and when it is in an inactivated state, the normal global I/O line (for example, GIO0) is connected to the input/output buffer DQ.

As shown in FIG. 6B, fuses corresponding to respective memory arrays ARY in the memory mat MAT are provided in the fuse block FB. More specifically, in each memory mat MAT, the fuse FUSE corresponding to the memory array ARY in which the replacement is to be performed is cut, and when the mat selection signal MS is activated, the redundancy selection signal RN corresponding to ARY in which the replacement is to be performed in the memory mat MAT corresponding to MS is activated. FIG. 6B shows the case where RN0 is activated when MS0 is activated and RN2 is activated when MS30 is activated.

Figure 7:
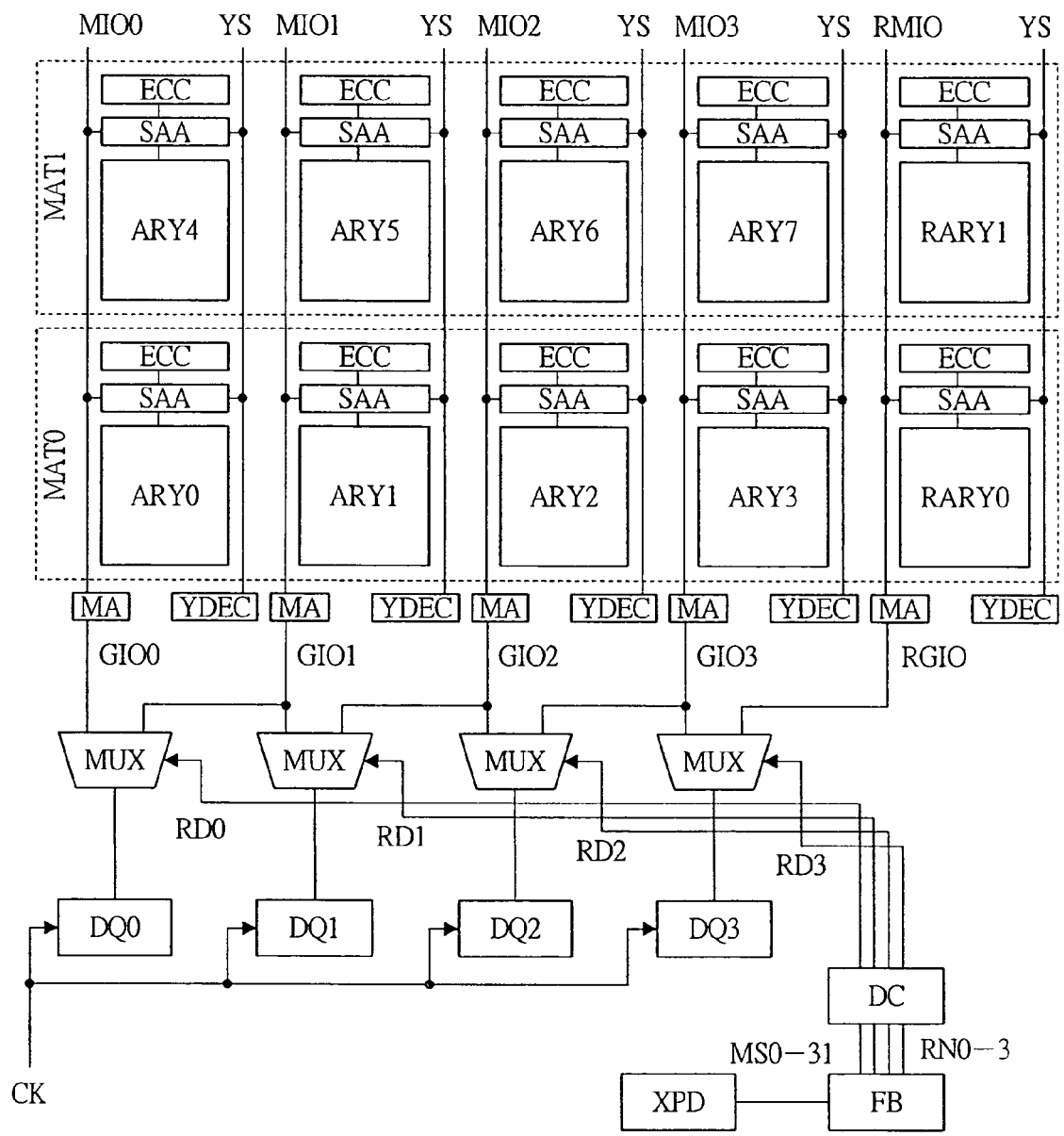
FIG. 7 is a block diagram showing another example of the structure having a redundant area in the memory bank in the semiconductor memory device shown in FIG. 1.

FIG. 7 is a block diagram showing another example of the structure having a redundant area in the memory bank in the semiconductor memory device shown in FIG. 1. The difference from the example in FIG. 5 lies in the connection between the normal global I/O line GIO and the multiplexer MUX. In FIG. 5 described above, the normal global I/O line GIO and the redundant global I/O line RGIO are connected to each multiplexer MUX corresponding to each DQ. Meanwhile, in the structure shown in FIG. 7, adjacent two global I/O lines GIO are connected to a multiplexer. More specifically, GIO0 and GIO1 are connected to the multiplexer MUX of DQ0. Similarly, the global I/O line GIO3 and the redundant I/O line RGIO are connected to the final input/output buffer DQ3.

In such a structure, when a failure occurs in ARY1 of MAT0, the redundancy selection signal RN1 is decoded by the decoder DC, the redundancy decode signal RD0 is inactivated, and RD1 to RD3 are activated. Then, when RD0 is in an inactivated state, GIO0 is connected to DQ0, and when RD1 to RD3 are in an activated state, GIO2 and DQ1, GIO3 and DQ2, and RGIO and DQ3 are respectively connected to each other. Accordingly, in addition to the advantage that the redundant replacement can be performed while applying the error correction, the advantage that the operation speed can be increased can be achieved by performing the substitution in units of memory array in which the error correction is to be performed, because the length of the redundant global I/O line RGIO can be shortened.

Figure 8:
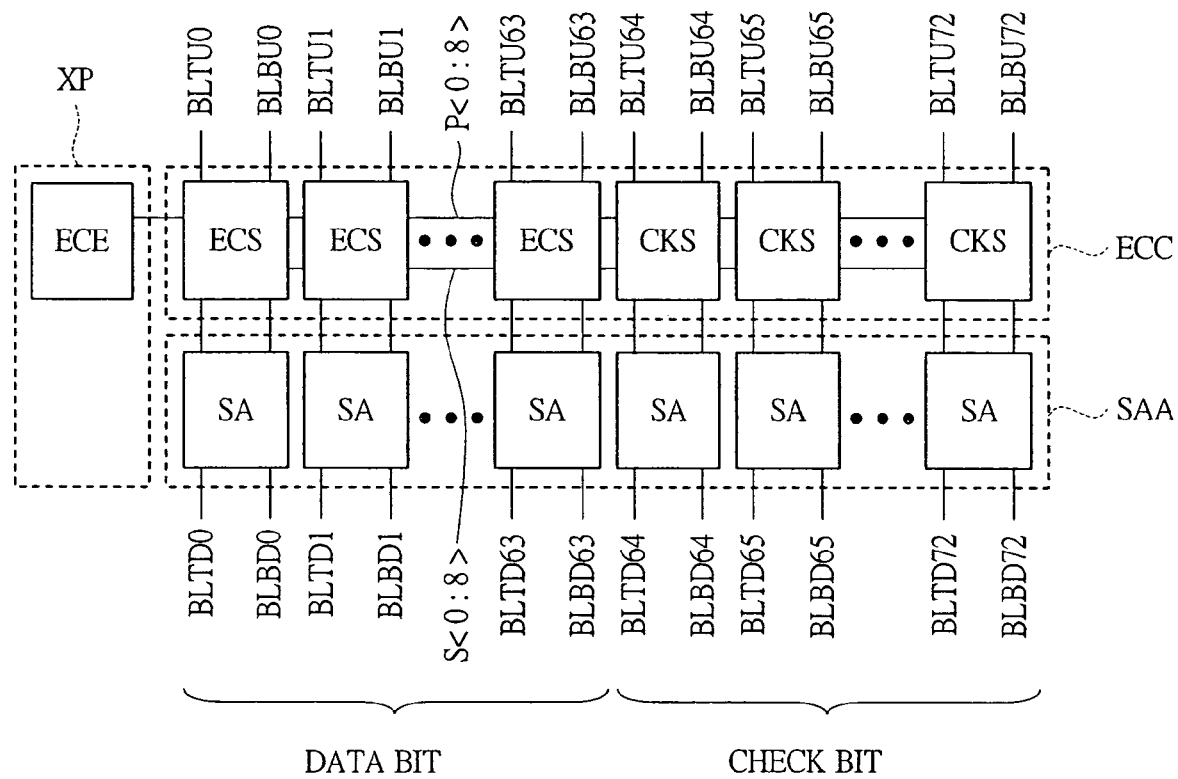
FIG. 8 is a schematic diagram showing an example of the detailed connection between the sense amplifier array and the error correction code circuit in the semiconductor memory device shown in FIG. 1.

FIG. 8 is a schematic diagram showing an example of the detailed connection between the sense amplifier array and the error correction code circuit in the semiconductor memory device shown in FIG. 1. The sense amplifier array SAA includes sense amplifiers SA to which the signal from the data bit is inputted and sense amplifiers SA to which the signal from the check bit is inputted. The error correction code circuit ECC includes ECC sub-circuits ECS for data bit corresponding to the sense amplifiers SA for data bit and ECC sub-circuits CKS for check bit corresponding to the sense amplifiers SA for check bit. SA and ECS are operated in a one-to-one manner and are shared by the bit line pairs BLTU/BLBU and BLTD/BLBD disposed above and below SA and ECS. Note that, in FIG. 8, 64 bit line pairs (BLT/BLB0 to BLT/BLB63), 64 sense amplifiers SA and 64 ECC sub-circuits ECS are provided so as to correspond to the signal of the data bit, and 9 bit line pairs (BLT/BLB64 to BLT/BLB72), 9 sense amplifiers SA and 9 ECC sub-circuits CKS are provided so as to correspond to the signal of the check bit.

Also, an ECC enable circuit ECE is disposed in the cross area XP. In ECE, nine syndrome prepare signals P<0:8> (hereinafter, nine signals from P<0> to P<8> are collectively referred to as P<0:8>) are activated. The detail of ECE will be described below with reference to FIG. 11. The signal is propagated from the left to the right while being arithmetically operated in the ECC and then inputted to the rightmost CKS, and the calculation result in CKS becomes the syndrome S<0:8>. Meanwhile, the syndrome S<0:8> is propagated from the right to the left and is used to determine the sense amplifier SA to which the error correction is performed.

The plurality of ECS and CKS can have the same circuit structure and circuit layout though the detailed structure thereof will be described below, and the wiring layout of the syndrome prepare signal P<0:8> and the syndrome S<0:8> is slightly different in each ECS or each CKS. Therefore, the layout thereof can be readily and efficiently formed so as to correspond to the sense amplifiers, and the reduction in circuit area can be achieved.

Figure 9:
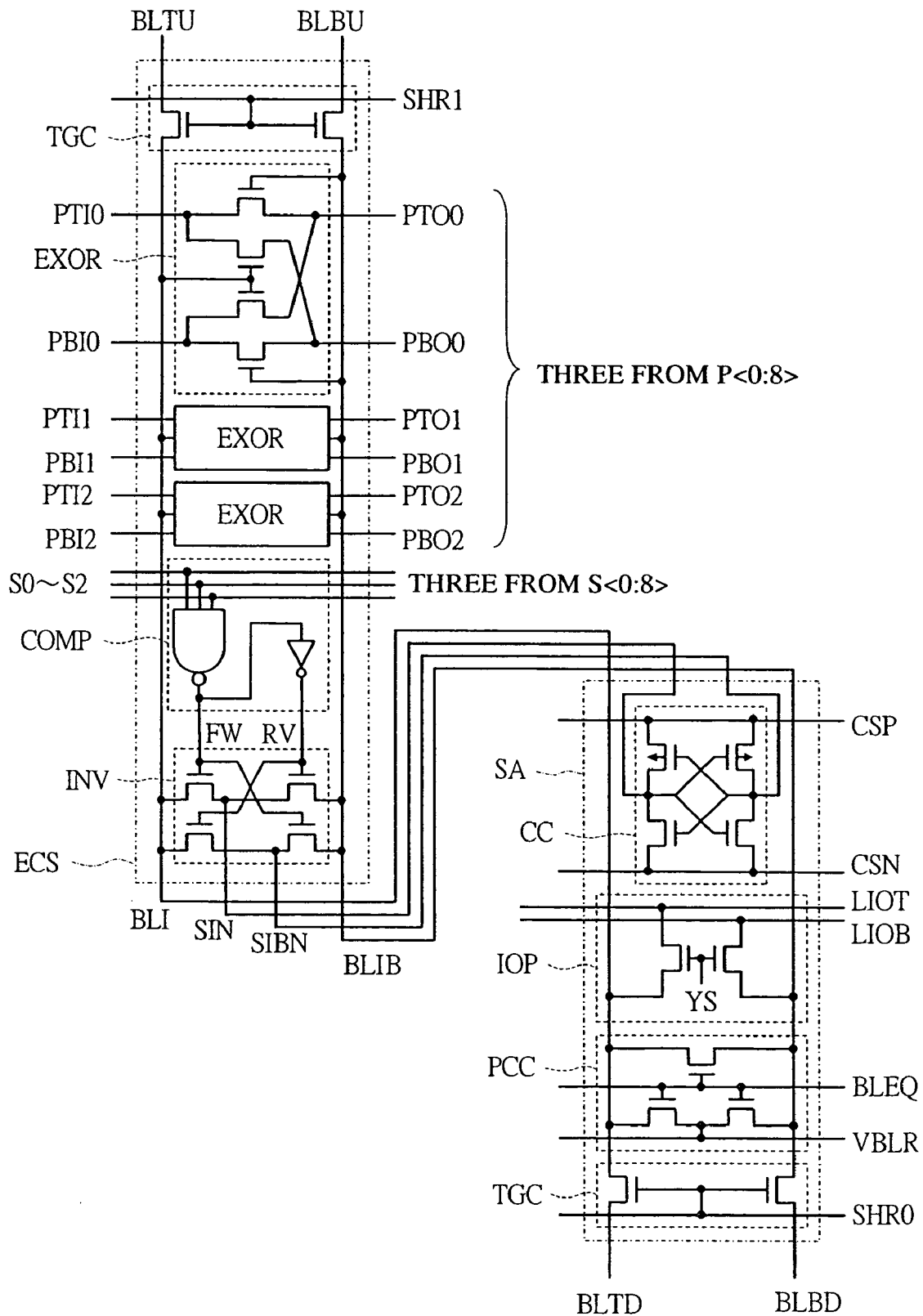
FIG. 9 is a circuit diagram showing an example of the detailed structure of the sense amplifier and ECC sub-circuit for data bit in the structure example in FIG. 8.

FIG. 9 is a circuit diagram showing an example of the detailed structure of the sense amplifiers and ECC sub-circuits for data bit in the structure example in FIG. 8. Each of the sense amplifiers SA includes a transfer gate TGC, a pre-charge circuit PCC, a cross-couple amplifier CC, and a read/write port IOP. The transfer gate TGC is a circuit which connects the sense amplifier SA and the memory array ARY when a sense amplifier isolation signal (SHR signal) is activated. The pre-charge circuit PCC equalizes the bit lines BLT and BLB which forms a pair when a bit line pre-charge signal (BLEQ signal) is activated and it pre-charges the bit lines to a bit line pre-charge level VBLR. The bit line pre-charge level VBLR is set at a midpoint VDL/2 of the bit line amplitude voltage VDL (the same level as the power supply voltage VCC from the outside of the chip or the level obtained by stepping down the voltage VCC).

The cross-couple amplifier CC is a circuit which drives a PMOS common source line CSP to the voltage VDL and an NMOS common source line CNS to the ground voltage VSS after a minute read signal from the memory cell MC is generated on the bit lines BLT and BLB, amplifies one of BLT and BLB having higher voltage to VDL and the other thereof to VSS, and then latches the amplified voltage. The read/write port IOP is a circuit which connects local IO lines (LIO line) LIOT/LIOB and the bit line pair BLT/BLB when the column selection line YS is activated. Note that the LIO lines LIOT/LIOB are retained at a pre-charge level in a stand-by state so as to prevent the current consumption in the unselected sense amplifier array SAA.

The ECC sub-circuit ECS for data bit includes a transfer gate TGC, an exclusive-OR circuit EXOR, a comparator COMP, and an inverter INV. The exclusive-OR circuit EXOR has a pass-transistor structure and is used to generate a check bit used to generate a syndrome for finding the sense amplifier having an error therein. In EXOR, the exclusive-OR operation between the data in each sense amplifier SA (that is, BLT/BLB) and the syndrome prepare signals from the left (that is, PTI/PBI) is performed, and the result thereof (that is, PTO/PBO) is transmitted to the ECS on the right.

Note that, as described above, in the error correction method according to this embodiment, the check bit of 9 bits is added to the data bit of 64 bits and the error correction of 1 bit is performed. The parity-check matrix for use therein is shown in FIG. 12 (detail thereof will be described below), in which only 3 bits of the values in a column element can be 1 and the others can be 0. Therefore, three EXOR are disposed in each ECS, and three of nine syndrome prepare signals P<0:8> are connected to the three EXOR. For its achievement, three lines of the nine wiring lines disposed in a metal wiring layer are extended to a lower layer and then connected to EXOR formed on a substrate.

Also, numbers of the three lines to be connected are the row numbers with 1 in the column corresponding to the sense amplifier in the parity-check matrix shown in FIG. 12. For example, in the second amplifier from the left, the syndrome prepare signals of P<0>, P<2>, and P<4> are connected to EXOR. More specifically, in the example shown in FIG. 9, P<0> is connected to PTI0 (inverted signal of P<0> is connected to PBI0), P<2> is connected to PTI1 (inverted signal of P<2> is connected to PBI1), and P<4> is connected to PTI2 (inverted signal of P<4> is connected to PBI2).

The comparator COMP is composed of three-input NAND circuit and an inverter. When an error occurs, the value of syndrome S<0:8> matches with a value of a column element in the parity-check matrix (called as a sense amplifier ID), and it can be understood that the error occurs in the sense amplifier corresponding to the matched sense amplifier ID. Therefore, in the manner as described above, the syndromes of the row numbers with 1 in the column corresponding to the sense amplifier in the parity-check matrix are inputted to the three-input NAND. For example, in the case of the second sense amplifier from the left described above, S<0> is connected to S0, S<2> is connected to S1, and S<4> is connected to S2 in FIG. 9. Then, only when the syndrome S<0:8> matches with the sense amplifier ID due to the error occurrence, the output of the three-input NAND becomes 0, and the inverted signal RV is activated. Accordingly, by using the circuit as described above, it is possible to check whether an error is present in the sense amplifier SA corresponding to the circuit.

The inverter INV is composed of four NMOSs and functions as a pass transistor. In an initial state, a forward signal FW is activated, and in this state, the sense operation is performed to latch the data to the cross-couple amplifier CC. Thereafter, when an error is observed in the data, the inverted signal RV is activated in response to the matching between the syndrome and the sense amplifier ID. Accordingly, since the connection between CC and the bit lines BLT/BLB is reversed, the data of BLT/BLB can be reversed by the driving force of CC.

Figure 10:
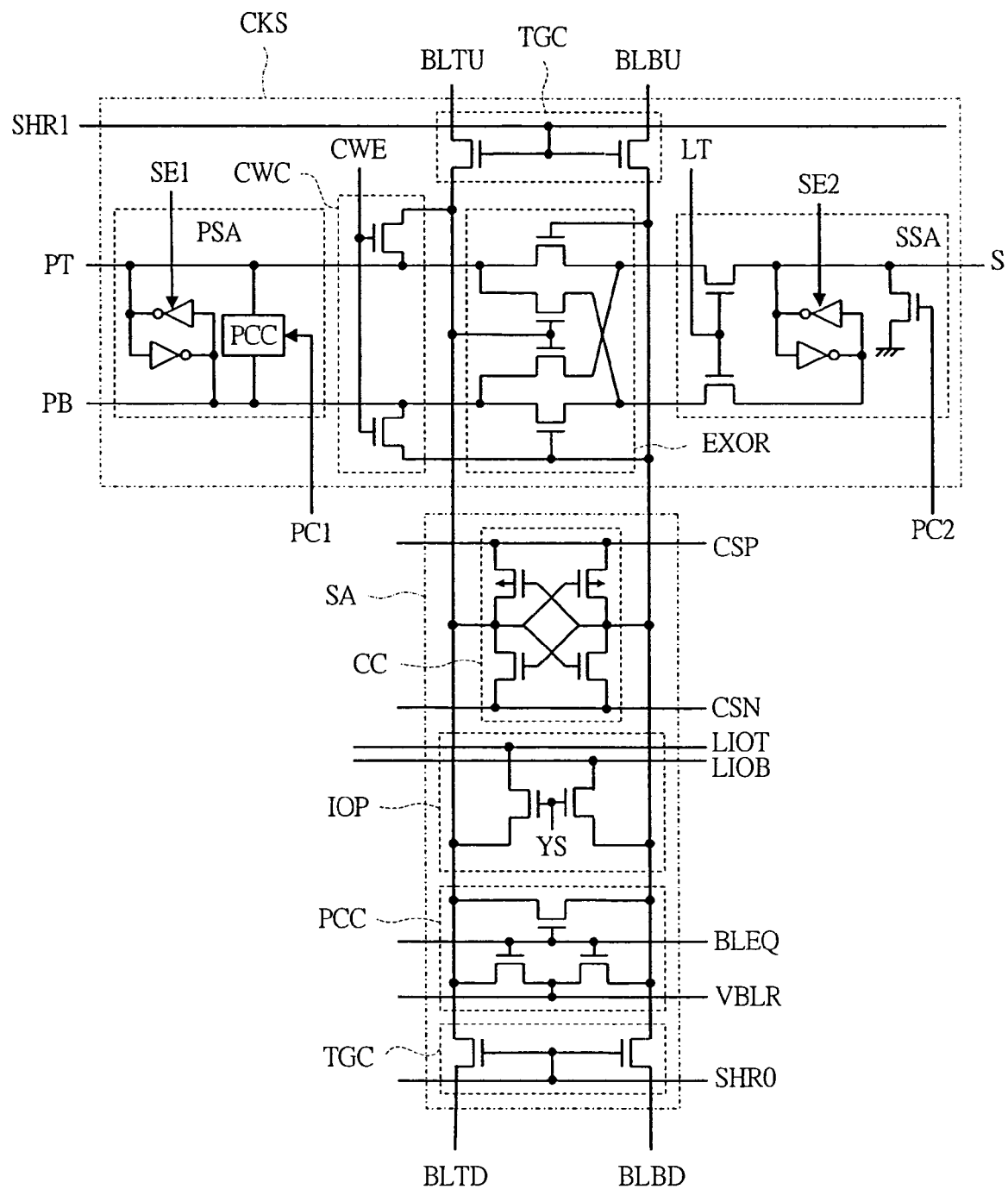
FIG. 10 is a circuit diagram showing an example of the detailed structure of the sense amplifier and ECC sub-circuit for check bit in the structure example in FIG. 8.

FIG. 10 is a circuit diagram showing an example of the detailed structure of the sense amplifier and ECC for check bit in the structure example in FIG. 8. Since the sense amplifier SA for check bit is the same as that for data bit described above, the description thereof is omitted.

The ECC sub-circuit CKS for check bit includes a transfer gate TGC, an exclusive-OR circuit EXOR, a syndrome prepare signal sense circuit PSA, a check bit write circuit CWC, and a syndrome sense circuit SSA.

The syndrome prepare signal sense circuit PSA is composed of a cross-couple inverter type sense amplifier SE1 and a pre-charge circuit PCC. In a stand-by state, the syndrome prepare signals PT and PB are pre-charged to the ground voltage VSS. After the activate command is inputted and the signal is read to the sense amplifier SA, the syndromes are calculated. As described above, since the syndrome prepare signals pass through a plurality of pass-transistor type exclusive-OR circuits, the amplitude thereof is greatly decreased at the input terminal of CKS. Therefore, PSA is operated as an amplifier circuit to amplify the minute signal to the full amplitude.

In an activate time, the check bit write circuit CWC is in an inactivate state (CWE is in an 'L' level). At this time, the exclusive-OR operation between the syndrome prepare signals PT/PB amplified by PSA and the data on the bit line pair BLT/BLB read from the check bit is performed by EXOR to output the operation result as the syndrome S. When an error occurs in a sense amplifier SA for data bit, the syndrome S is activated. Then, in the syndrome sense circuit SSA, the outputted syndrome S is amplified and LT is inactivated, thereby latching the state.

Meanwhile, when the pre-charge command is received, the syndrome prepare signals PT/PB through the exclusive-OR operation in the data bit are amplified in PSA. Thereafter, the check bit write circuit CWC is activated (CWE is set to an 'H' level). Then, the amplified PT/PB is directly written as the check bit into the sense amplifier SA and memory cell for check bit.

As described above, in the structure example in FIG. 10, two sense amplifiers are provided in CKS and a pass gate is provided therebetween, which makes it possible to isolate the two sense amplifiers from each other. Therefore, the syndrome S calculated in the activate time can be retained in the sense amplifier SE2 in the latter SSA. Accordingly, in FIG. 9, since the value of FW or RV can be retained until the pre-charge is performed, when the error correction (inverted write by RV) is necessary, the error correction can be performed without fail. Furthermore, even when the write command is generated in the period between the activate and the pre-charge, the appropriate data write can be performed to the memory cell of the data bit.

Also, by isolating SSA and PSA by LT, when the write command is generated, the error correction information (syndrome) resulting from the activate can be retained in SSA, and the value of the check bit generated by the subsequent write command (syndrome prepare signal) can be retained in PSA. Also, the value retain in PSA is written in the memory cell of the check bit at the time of the pre-charge.

Note that, when 1-bit error occurs in the check bit, the check bit is not needed to read the data to the outside, and the correction is unnecessary. Therefore, the inverter is not provided for the check bit. In this case, since the syndrome does not match, the data bit is not erroneously inverted, and it does not cause any problem. Before the pre-charge command is inputted and the word line is inactivated, the check bit is calculated again based on the new data bit rewritten in the write time and is written in the memory cell.

Also, the number of check bits added to detect 1-bit error in the data bit of N=64 bits may be 7 bits. In the case where the number of check bits is set to M=8 larger than or equal to log 2(N)+2, the error of 2 bits can be detected. However, in the present invention, the number of check bits is 9 bits which is larger than or equal to log 2(N)+2, only the detection of 1-bit error is performed for the simplification of the circuit structure. By this means, the area of the ECC circuit and the operation delay thereof can be reduced.

Figure 11:
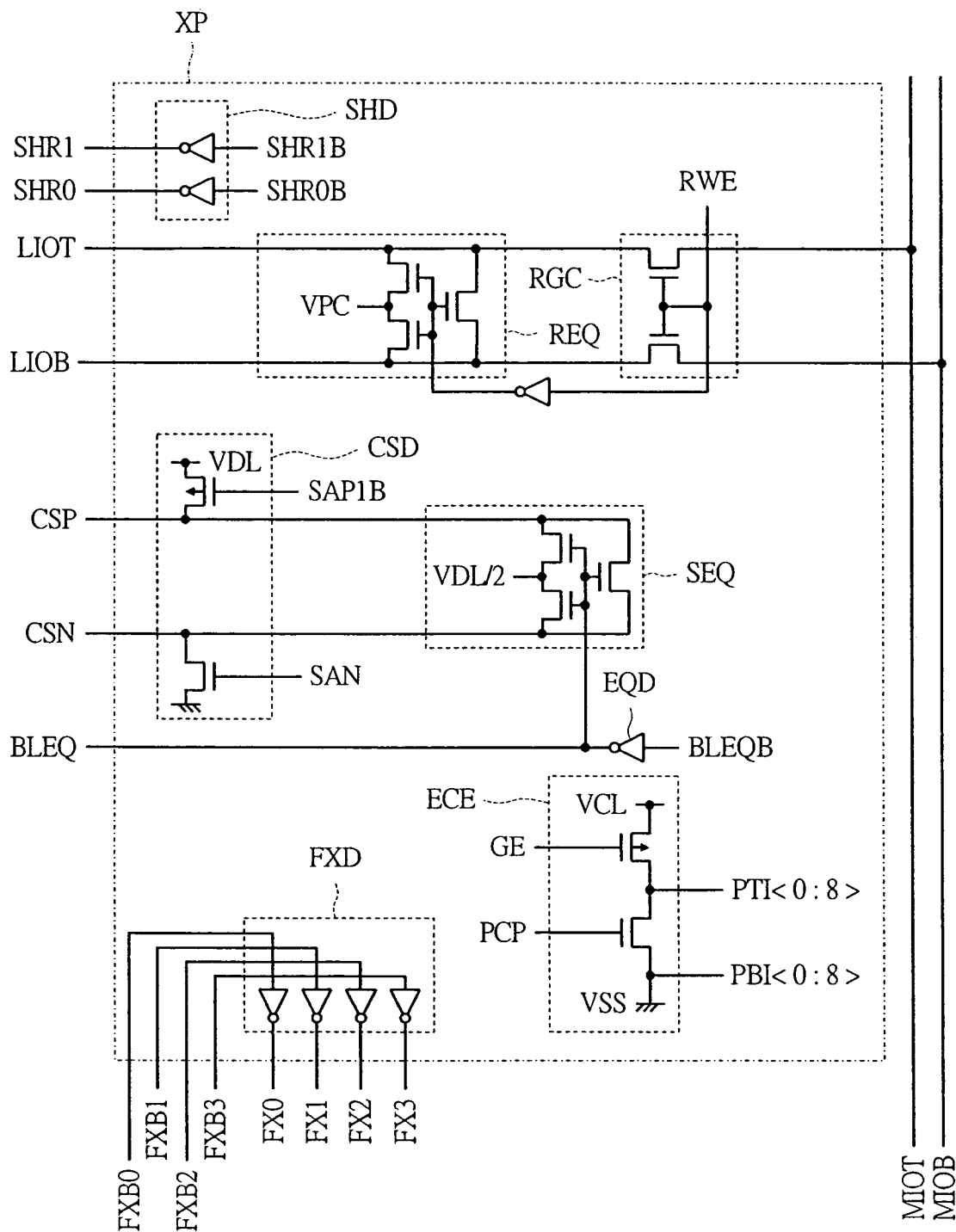
FIG. 11 is a circuit diagram showing an example of the structure of a cross area in the semiconductor memory device shown in FIG. 1.

FIG. 11 is a circuit diagram showing an example of the structure of the cross area in the semiconductor memory device shown in FIG. 1. The cross area XP is provided with an SHR signal driver SHD, an LIO line pre-charge circuit REQ, a read/write gate RGC, a CS line driver CSD, a CS line pre-charge circuit SEQ, a BLEQ signal driver EQD, an FX line driver FXD, and an ECC drive circuit ECE.

A complementary signal SHRB of the SHR signal is inputted to the SHR signal driver SHD, and an inverted signal thereof is outputted from the SHR signal driver SHD. The LIO line pre-charge circuit REQ pre-charges the LIO lines LIOT/LIOB to the voltage VPC when the read/write enable signal RWE is in an inactivate VSS level. The read/write gate RGC connects the LIO lines LIOT/LIOB and the main IO lines MIOT/MIOB when the read/write enable signal RWE is at an activate voltage VCL (which is used as a peripheral circuit power supply voltage at the same level as the external VCC level or the level obtained by stepping down the VCC level).

The CS line driver CSD is a circuit which drives the NMOS common source line CSN to the ground voltage VSS when the NMOS sense amplifier enable signal SAN is in an activate state and drives the PMOS common source line CSP to the voltage VDL ('H' level of bit line) when the PMOS sense amplifier enable signal SAP1B is in an activate state (VSS level).

The CS pre-charge circuit SEQ is a circuit which pre-charges the PMOS common source line CSP and the NMOS common source line CSN to VDL/2 when the BLEQ signal is activated. The complementary signal BLEQB of the pre-charge signal BLEQ is inputted to the BLEQ signal driver EQD, and the inverted signal thereof is outputted from the BLEQ signal driver EQD. The signal FXB is inputted to the FX line driver FXD, and the FX line driver FXD outputs the complementary signal thereof to the sub-word driver selection line FX (FX line).

In the ECC drive circuit ECE, the syndrome activate signal GE is received, and nine syndrome prepare signals PTI<0:8> are activated to VCL. PBI<0:8> remain VSS. As understood from FIG. 8, the signals PTI and PBI are the initial values of the signal inputted to the first ECS, and they are propagated from the left to the right while being arithmetically operated in the ECC. Then, they become the check bit in the rightmost CKS and are used in the calculation of the syndrome S<0:8>. When the calculation of the syndrome is finished to be in the stand-by state after the pre-charge command, PCP is activated and both PTI<0:8> and PBI<0:8> are pre-charged to VSS.

Figures 12A, 12B:
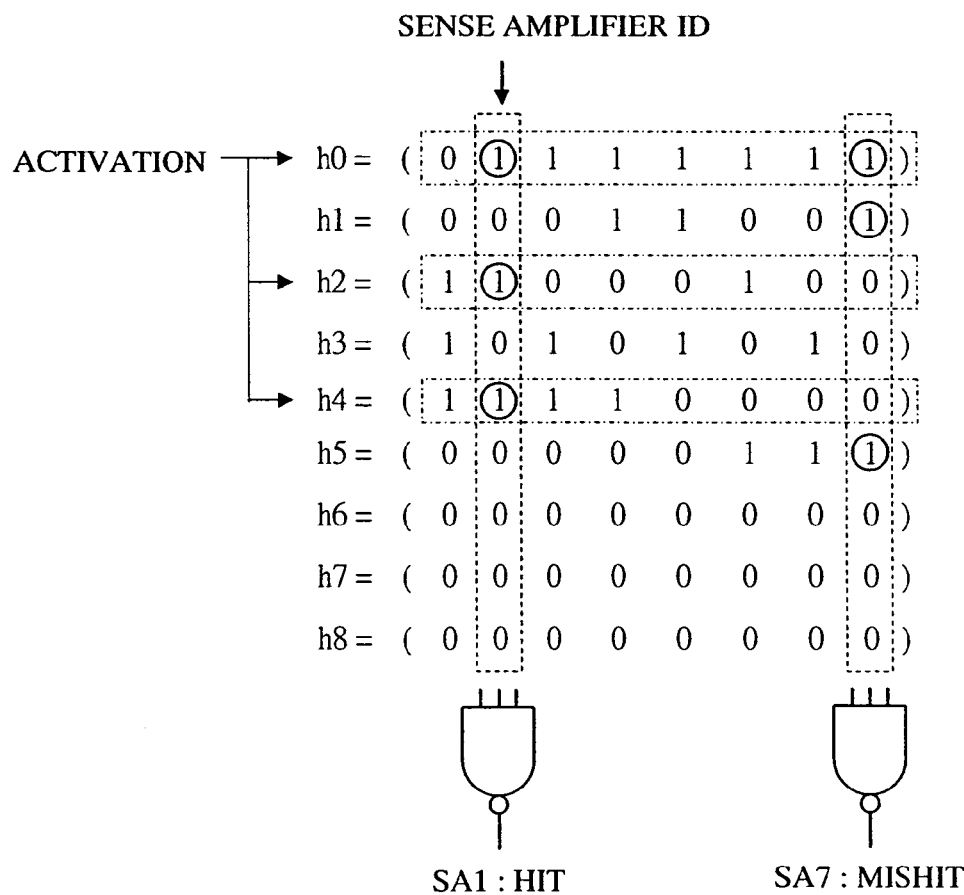
FIG. 12A is an explanatory diagram of a parity-check matrix used in the error correction code circuit in the semiconductor memory device shown in FIG. 1.
FIG. 12B is an explanatory diagram of each element in the parity-check matrix in FIG. 12A used in the error correction code circuit in the semiconductor memory device shown in FIG. 1.

FIG. 12 is an explanatory diagram of an example of the codes used in the error correction code circuit in the semiconductor memory device shown in FIG. 1, in which FIG. 12A is an explanatory diagram of a parity-check matrix and FIG. 12B is an explanatory diagram of each element in the parity-check matrix in FIG. 12A. The parity-check matrix H shown in FIG. 12A has a structure of 64 columns×9 rows obtained by aligning 8 submatrixes each composed of 8 columns×9 rows, and the submatrix of 8 columns×9 rows has the values as shown in FIG. 12B. Also, in the parity-check matrix H in FIG. 12A, along with the increase of the column number of the submatrixes, the row elements (h0, h1, . . . , h8) in the submatrixes are circulated by 1 bit in the row direction. In the case where such codes are used, 3 bits of the 9 bits of the column elements in the submatrix become '1' and the other 6 bits become '0' when an error occurs.

More specifically, when such a parity-check matrix H is mounted in the error correction code circuit ECC, 64 columns of the parity-check matrix H correspond to 64 sense amplifiers, and the row elements (h0, h1, . . . , h8) of the 9 rows correspond to the syndrome prepare signals P<0:8> and the syndrome S<0:8>. In this case, P<2> (third row of the parity-check matrix H) is taken as an example. First, after the activate command, the exclusive-OR operation for the sense amplifiers SA0, SA1, and SA5 corresponding to h2 is performed by EXOR in ECS (zeroth ECS, first ECS, and fifth ECS from the left) in a left part of FIG. 8. Then, the result of the operation is transmitted to the ECS on the right, and the exclusive-OR operation for the sense amplifiers SA11, SA12, and SA15 corresponding to h1 is performed by EXOR in the ECS. Finally, the exclusive-OR operation for the sense amplifiers SA56, SA57, SA58, and SA59 corresponding to h4 is performed by EXOR in the rightmost ECS, thereby determining the final value of P<2>. Then, this value is inputted to, for example, the third CKS from the left of FIG. 8 corresponding to P<2>.

This operation result inputted to CKS is written as the check bit into the memory cell via the sense amplifier SA and the bit line pair BLT/BLB66 at the time of the pre-charge command. Thereafter, at the time of next activate command, the data of this memory cell is read, and the data of next P<2> is generated in the same manner by the activate command. Then, the exclusive-OR operation of the read data and the data of the generated P<2> is performed by EXOR in the third CKS, and the operation result becomes syndrome S<2>. Therefore, when an error is present in the data of SA1 connected to P<2>, the value of S<2> becomes '1'. Also, when an error is present in SA1, since SA1 is connected to P<0> and S<0>, and P<4> and S<4> in addition to P<2> and S<2> as shown in FIG. 12B, the values of S<0> and S<4> also become '1'.

As described above, since the generated syndrome matches with the column element of the parity-check matrix corresponding to the sense amplifier in which an error occurs, the column element can be considered as the sense amplifier ID. Therefore, the syndromes of the row numbers having 1 in the column corresponding to the sense amplifier in the parity-check matrix are inputted to the three-input NAND. Only when the syndrome and the sense amplifier ID match with each other, the output of the three-input NAND becomes 0, and the inverted signal RV is activated. FIG. 12B shows the example where the syndromes S<0>, S<2>, and S<4> are activated and the second SA1 from the left is hit. In this case, the state of SA1 is inverted by the inverter INV in FIG. 9 to obtain the correct data.

Note that the comparators for 9 bits are necessary for the comparison of the inputs of 9 bits. However, in the error correction method of this embodiment, only the error correction of 1 bit is supported. Therefore, it is not necessary to check the data patterns of all bits of the syndromes. More specifically, in the error correction method described here, the parity-check matrix is defined on the basis of the concept of $_9C_3=84$ (>64 bits). Therefore, the comparator can be formed from only the three-input NAND in ECS as described above. Accordingly, the reduction in circuit area can be achieved. Also, the comparison operation can be performed at high speed.

Incidentally, for the distinction of 64 bits, the check bit of at least 7 bits is necessary. In this case, however, since the determination for checking 0 and 1 of all 7 bits is required, the comparator is complicated, and the circuit area is increased. Further, in the case where the check bit of 8 bits is used, for example, since $_8C_4=70$ ($\geq 64$ bits) is obtained, the parity-check matrix based on it is defined and the comparator of the four-input NAND can be used in ECS. Practically, the increase in circuit area of ECS in such an extent is acceptable. Therefore, it is desired that the check bit of 8 or more bits is provided for the data bit of 64 bits, and it is more desired to provide the check bit of 9 bits as shown in FIG. 12B. Furthermore, for example, in the case where the check bit of 12 bits is used, since $_{12}C_2=66$ ($\geq 64$ bits) is obtained, the two-input NAND is available. If the area penalty of the memory cell due to the check bit is within an acceptable range, the check bit as described above can be used.

Figure 13:
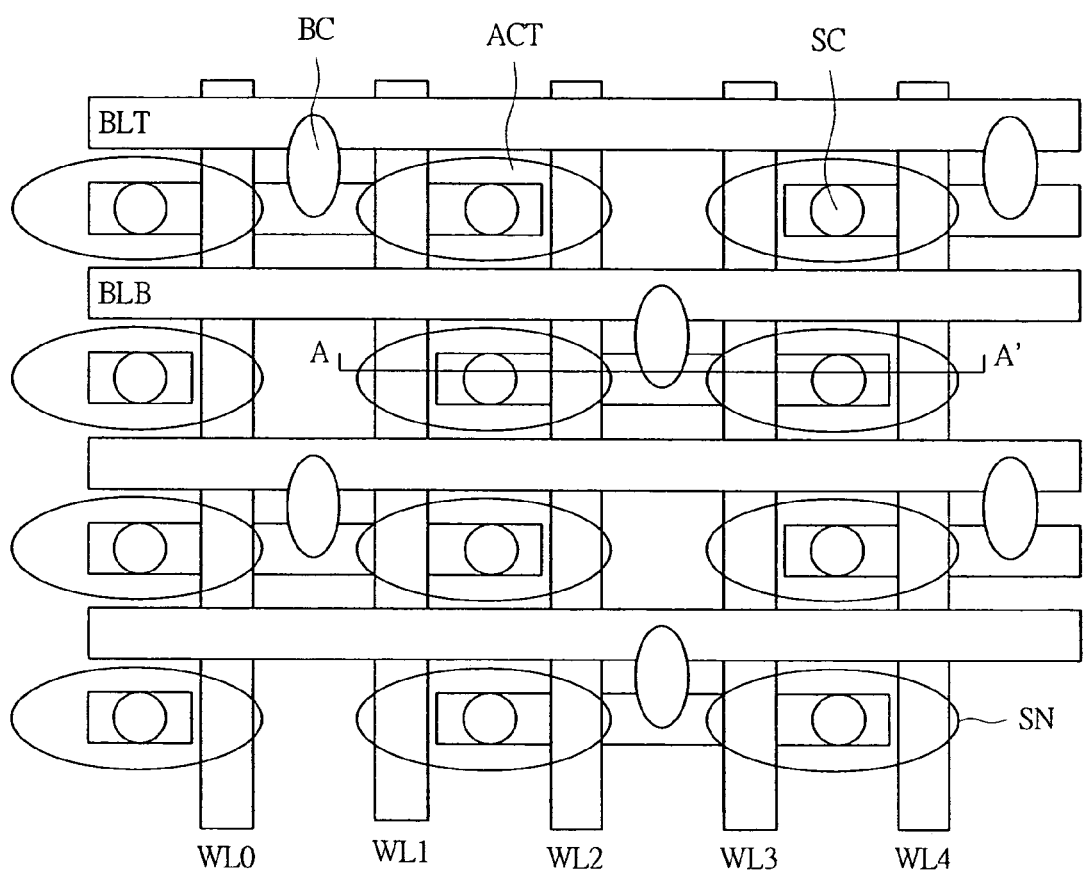
FIG. 13 is a diagram showing an example of the layout of the memory array in the semiconductor memory device shown in FIG. 1.
Figure 14:
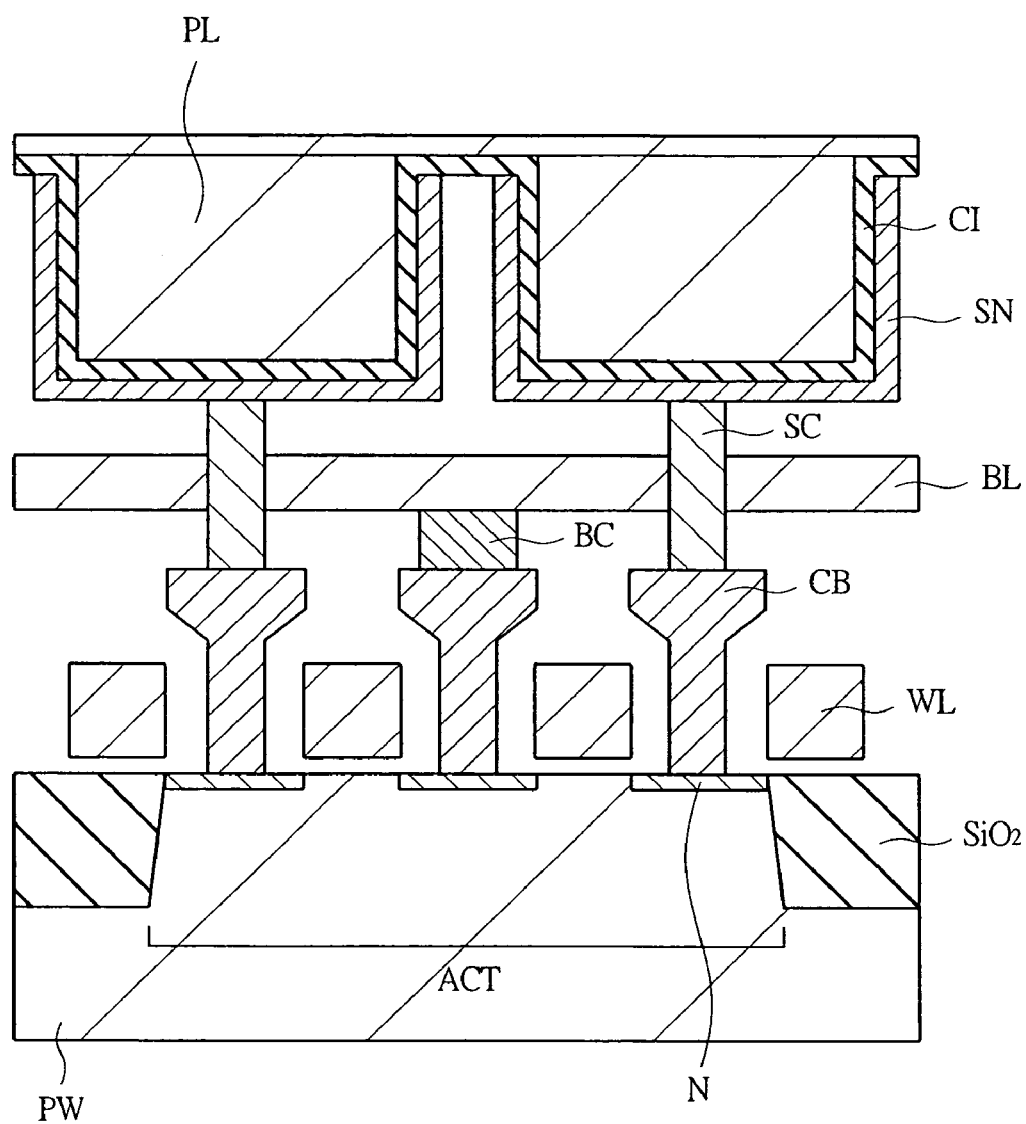
FIG. 14 is a diagram showing an example of the cross-sectional structure taken along the line A-A' in the layout in FIG. 13.

FIG. 13 is a diagram showing an example of the layout of the memory array in the semiconductor memory device shown in FIG. 1. FIG. 14 is a diagram showing an example of the cross-sectional structure taken along the line A-A' in the layout in FIG. 13. The layout shown in FIG. 13 includes a plurality of word lines WL0 to WL4 and a plurality of bit line pairs BLT/BLB, in which the complementary operation can be performed by the bit line pair BLT/BLB. Note that, in the layout as described above, the bit line pair BLT/BLB intersects with one word line, and such a layout is called a two-intersection memory array.

In such a layout, a plurality of active regions ACT are formed in parallel to the bit lines, and two word lines extend on each of the active regions ACT. Two memory cell transistors having the two word lines as respective gates thereof are formed in each active region ACT. One ends of the source/drain of the two memory cell transistors are connected to the bit line through a common bit line contact, and the other ends thereof are connected to the different storage nodes SN through the different storage node contacts SC. Note that the storage node SN is designed to have a width in the bit line direction large enough to overlap the adjacent two word lines.

As shown in FIG. 14, each DRAM memory cell has an N channel MOS transistor (memory cell transistor) formed on a semiconductor substrate PW and a stacked capacitor provided on the bit line BL. In FIG. 14, two word lines WL are disposed on the active region ACT in the semiconductor substrate PW isolated by the insulating film $SiO_2$, the two word lines are used as the gates of the memory cell transistors, and N type diffusion layer regions N to be the source/drain thereof are provided in the semiconductor substrate PW.

A contact CB is disposed on the N type diffusion layer region N between the two word lines WL, and the bit line contact BC is disposed on the contact CB. A bit line BL extending in a direction perpendicular to the extending direction of the word line is formed on the bit line contact BC. On the other hand, on the N type diffusion layer regions N outside the two word lines WL, the contacts CB are formed, and the storage node contacts SC are formed thereon. The storage node SN in a concave shape (cylinder shape) formed on an inner surface of the hole in an interlayer insulating film (not shown) is disposed on each of the storage node contacts SC, and a plate electrode PL is embedded in the storage node SN. Further, a capacitor insulating film CI is formed between PL and SN, and thus, a capacitor Cs is formed from CI, SN, and PL.

Figure 15:
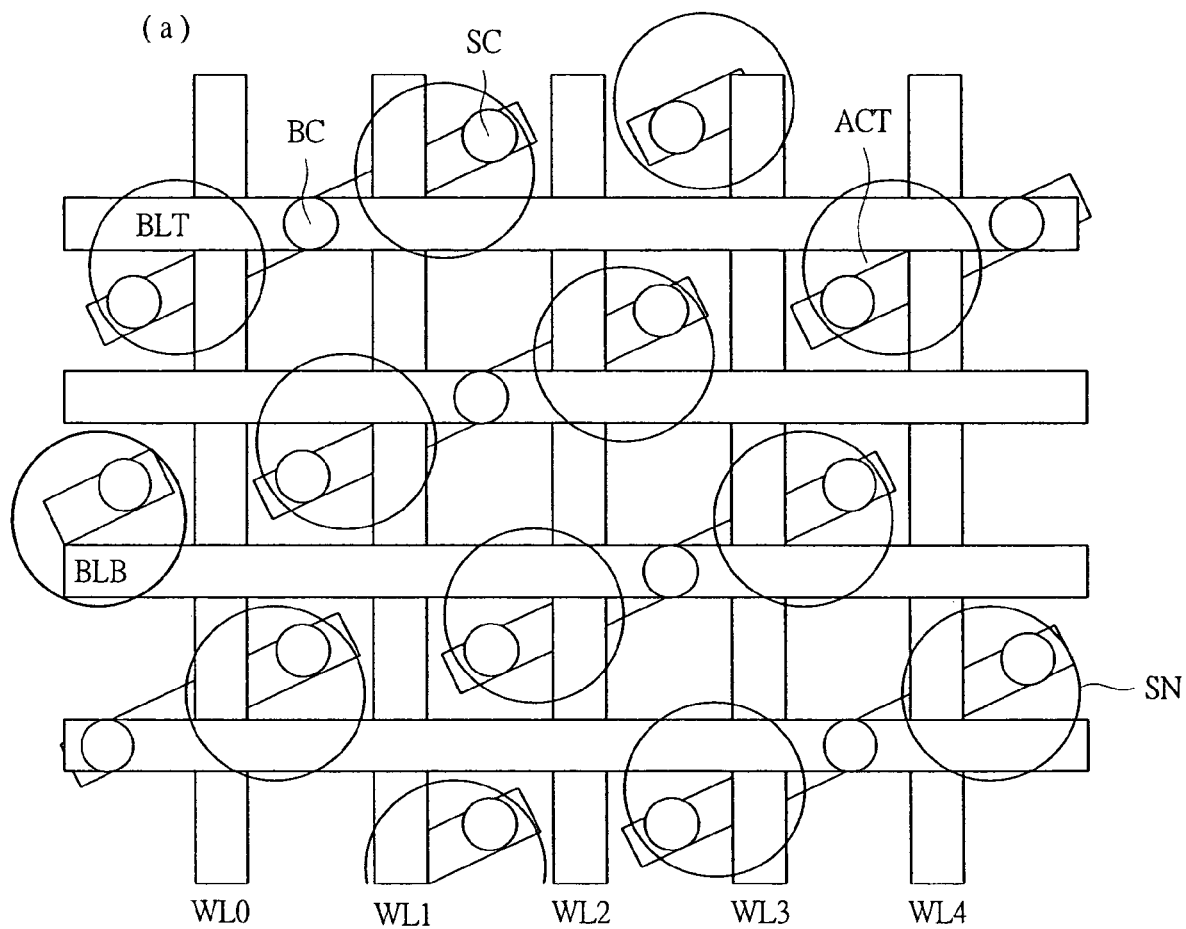
FIG. 15 is a diagram showing an example of the layout of the memory array different from that of FIG. 13.

FIG. 15 is a diagram showing an example of the layout of the memory array different from that of FIG. 13, in the semiconductor memory device shown in FIG. 1. This layout is called a pseudo two-intersection memory array (quarter pitch memory array), and it includes a plurality of word lines WL0 to WL4 and a plurality of bit lines, in which the complementary operation is performed by the bit line pair BLT/BLB having one bit line interposed therebetween.

In the layout in FIG. 15, different from that in FIG. 13 described above, the active regions ACT are obliquely disposed relative to the bit line, and the two storage node contacts SC in the active regions ACT are formed on both sides of the bit line, respectively. In such a layout, since the storage node SN can be designed to have an almost circular shape, it is possible to readily acquire the capacitance of the capacitor even in the case of the further miniaturization. Also, in the pseudo two-intersection memory array and the two-intersection memory array as described above, since the bit line and the reference bit line in which the signal is generated are present in the same memory array, the noise can be reduced.

Figure 16:
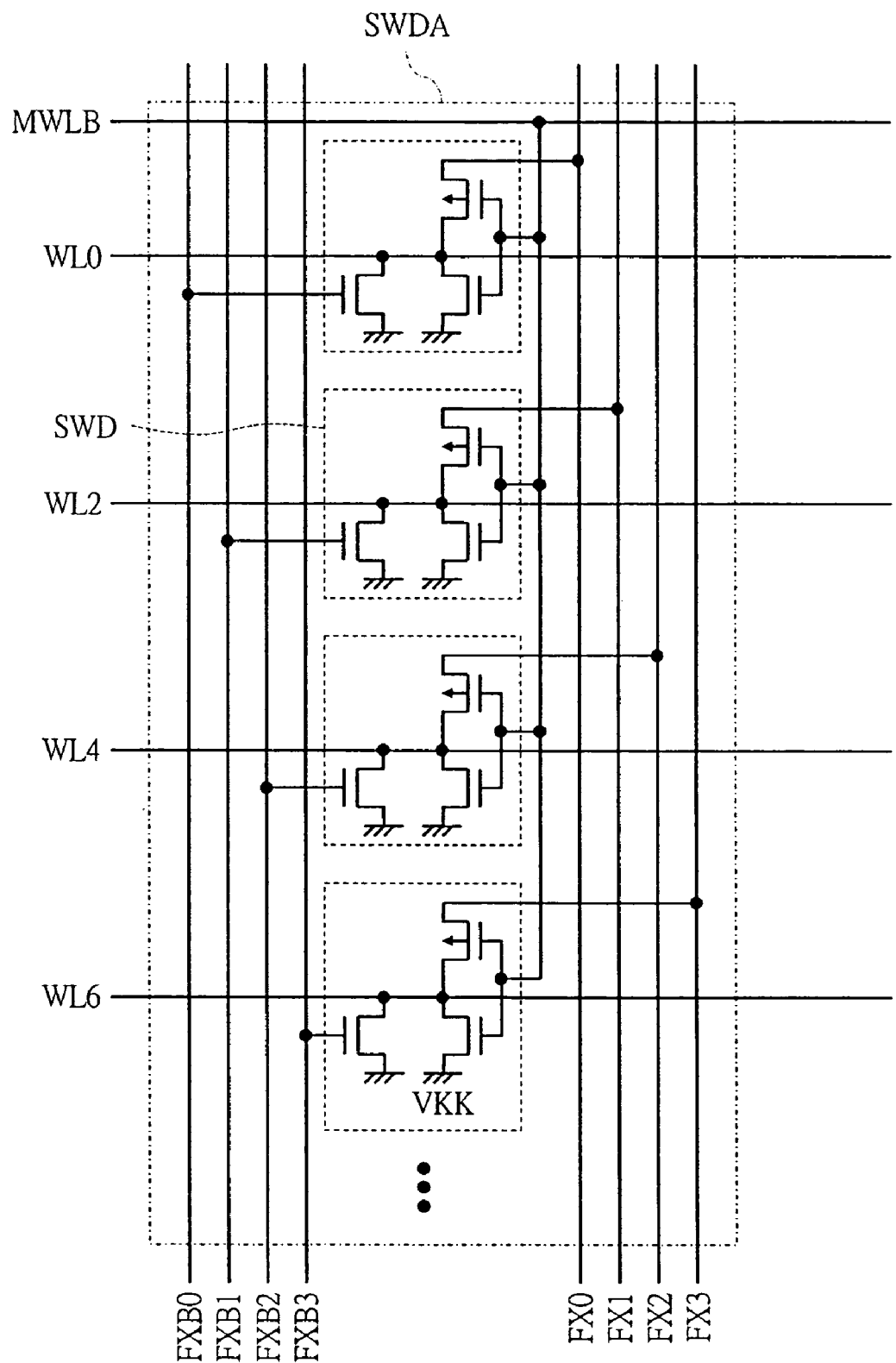
FIG. 16 is a circuit diagram showing an example of the structure of the sub-word driver array in the semiconductor memory device shown in FIG. 1.

FIG. 16 is a circuit diagram showing an example of the structure of the sub-word driver array in the semiconductor memory device shown in FIG. 1. The sub-word driver array SWDA is composed of a plurality of sub-word drivers SWD. As shown in FIG. 1B and others, the sub-word driver array SWDA is disposed around the memory array ARY.

The sub-word driver SWD drives the word lines WL in the memory arrays ARY disposed on both sides thereof. Also, as described in FIG. 4, since the sub-word driver array SWDA and the memory array ARY are alternately disposed, the word lines WL (sub-word line) in the memory array ARY are alternately connected to the left sub-word driver SWD and the right sub-word driver SW D.

The sub-word driver SWD is composed of two N channel MOS transistors and one P channel MOS transistor. One N channel MOS transistor has a gate to which the main word line MWLB is connected, a drain to which the word line WL is connected, and a source to which the voltage VKK is connected. The other N channel MOS transistor has a gate to which the complementary word driver selection line FXB is connected, a drain to which the word line WL is connected, and a source to which the voltage VKK is connected. In this case, the voltage VKK is lower than the voltage VSS generated in a negative voltage generating circuit.

The P channel MOS transistor has a gate to which the main word line MWLB is connected, a drain to which the word line WL is connected, and a source to which the sub-word drier selection line FX is connected. Four pairs of sub-word driver selection lines FX0 to FX4 are laid to one sub-word driver array SWDA, and one of the four sub-word drivers SWD connected to one main word line MWLB is selected to activate one word line WL.

Figure 17:
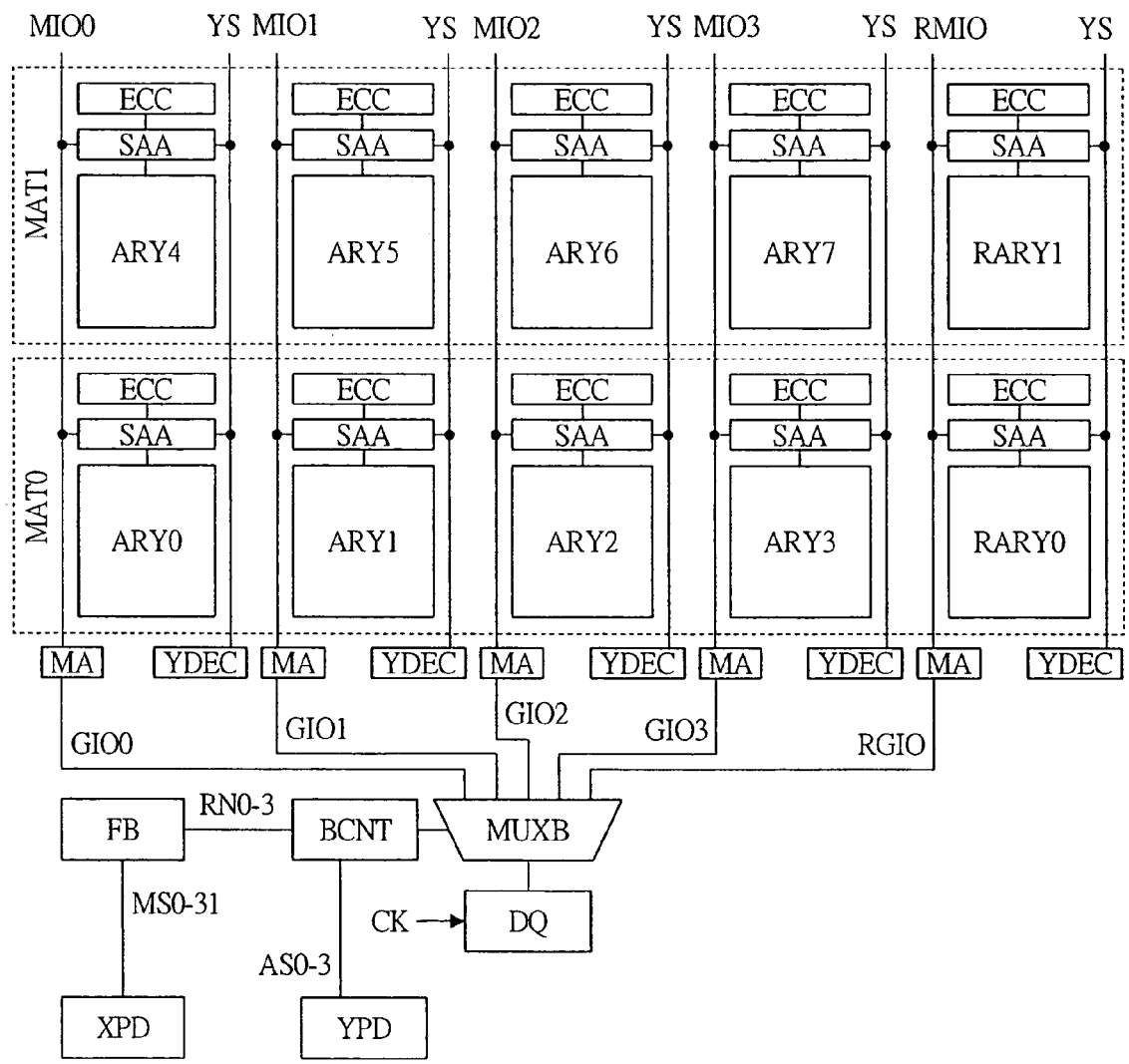
FIG. 17 is a block diagram showing another example of the structure having a redundant area in the memory bank in the semiconductor memory device shown in FIG. 1.

FIG. 17 is a block diagram showing another example of the structure having a redundant area in the memory bank in the semiconductor memory device shown in FIG. 1. The difference from the structure example in FIG. 5 lies in the number of input/output buffers DQ and the connection between the global I/O line and the multiplexer. In the structure example in FIG. 17, a plurality of normal global I/O lines GIO0 to GIO3 and a redundant global I/O line RGIO are connected to the multiplexer MUXB corresponding to one input/output buffer DQ. Also, the data from GIO0 to GIO3 is serially outputted to DQ in accordance with the clock signal CK in the order controlled by a burst counter BCNT. At this time, the data from the memory array ARY to be substituted is interchanged with the data from the redundant memory array RARY by controlling the burst counter BCNT.

The initial addresses AS0 to AS3 when performing the burst operation are inputted from a column address pre-decoder YPD to the burst counter BCNT. Also, the number of the memory array ARY to be replaced in each memory mat MAT is programmed to the fuse block FB in advance. When the activate command is inputted to DRAM, the mat selection lines MS0 to MS31 are inputted to FB from the row address pre-decoder XPD, and in this memory mat MAT, the redundancy selection signal RN corresponding to the memory array ARY to be replaced is activated and then transmitted to BCNT.

Figure 18:
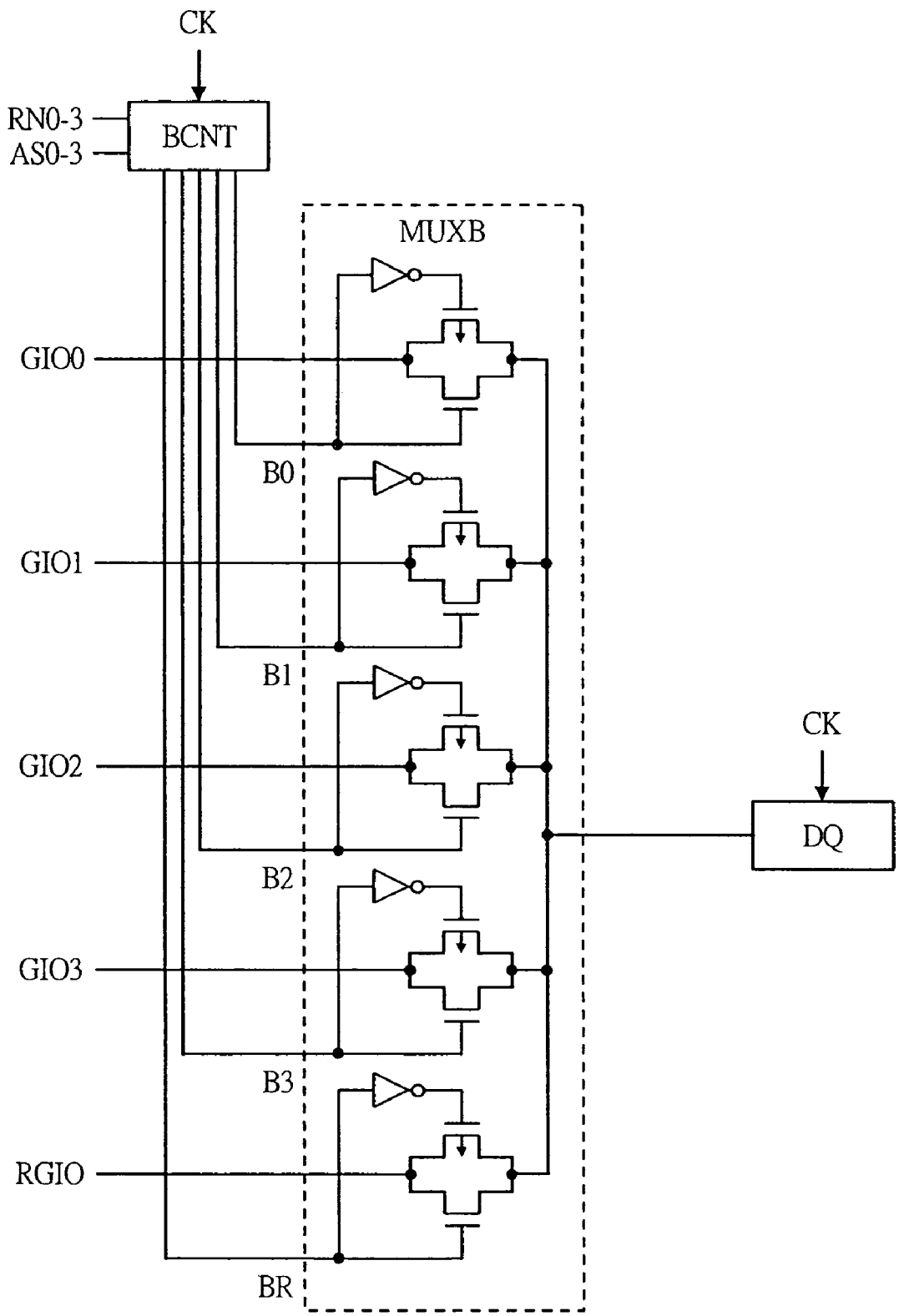
FIG. 18 is a circuit diagram showing an example of the structure of the multiplexer in the structure example in FIG. 17.

FIG. 18 is a circuit diagram showing an example of the structure of the multiplexer in the structure example in FIG. 17. All the normal global I/O lines GIO0 to GIO3 to which the burst data is transmitted and the redundant global I/O line RGIO are connected to the multiplexer MUXB shown in FIG. 18. The connection between the respective global I/O lies and the input/output buffer DQ is controlled by GIO selection signals B0 to B3 and BR outputted from the burst counter BCNT. The burst initial addresses AS0 to AS3 and the redundancy selection signals RN0 to RN3 are inputted to BCNT.

Figure 19A:
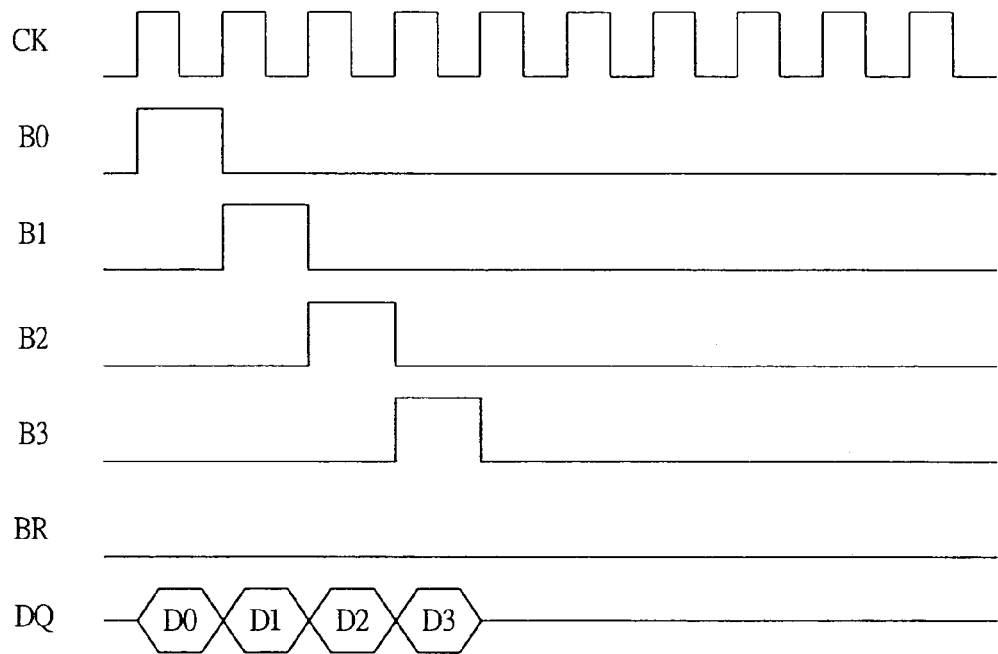
FIG. 19A is a waveform diagram showing an example of the operation in the structure example in FIG. 18, in which the redundant replacement is not performed.
Figure 19B:
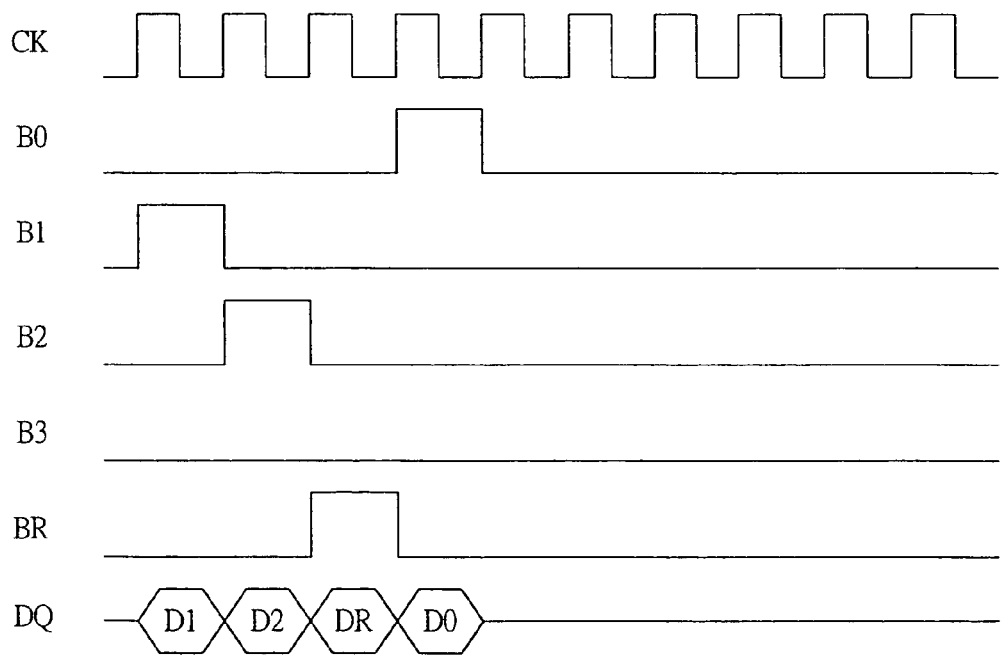
FIG. 19B is a waveform diagram showing an example of the operation in the structure example in FIG. 18, in which the redundant replacement is performed.

FIG. 19 is a waveform diagram showing an example of the operation in the structure example in FIG. 18, in which FIG. 19A is a waveform diagram in the case where the redundant replacement is not performed and FIG. 19B is a waveform diagram in the case where the redundant replacement is performed. FIG. 19A shows the case where the initial address is '0' and the substitution is not performed, in which ASO='H', AS1 to AS3='L', and RN0 to RN3='L' are inputted to the burst counter BCNT. In this case, the GIO selection signals B0 to B3 are activated in accordance with the clock signal CK in this order, and the data D0 to D3 corresponding to the data of GIO0 to GIO3 are serially outputted from the input/output buffer DQ.

FIG. 19B shows the case where the initial address is '1' and ARY3 is substituted for RARY0. For example, AS1='H', AS0, AS2, and AS3='L', RN0 to RN2='L', and RN3='H' are inputted to the burst counter BCNT. In this case, the GIO selection signals are activated in accordance with the clock signal CK in the order of B1, B2, BR, and B0, and the data D3 from GIO3 is substituted for the data DR from RGIO when BR is activated. Therefore, the data are outputted from the input/output buffer DQ in the order of D1, D2, DR, and D0. By using the structure and operation as described above, the replacement in units of redundant block can be efficiently performed when the burst operation is performed by using the data from a plurality of memory arrays to the DRAM having a small number of input/output buffers DQ and a long burst length.

Figure 20:
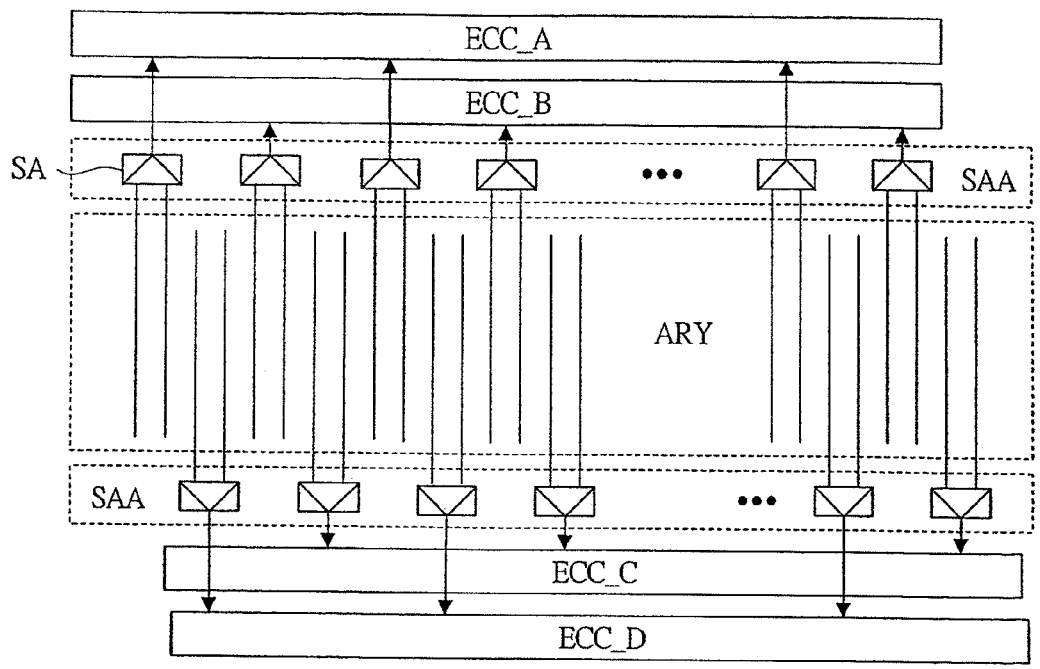
FIG. 20 is a schematic diagram showing a modification example of the layout of the error correction code circuits in the structure example shown in FIG. 4.
Figure 21:
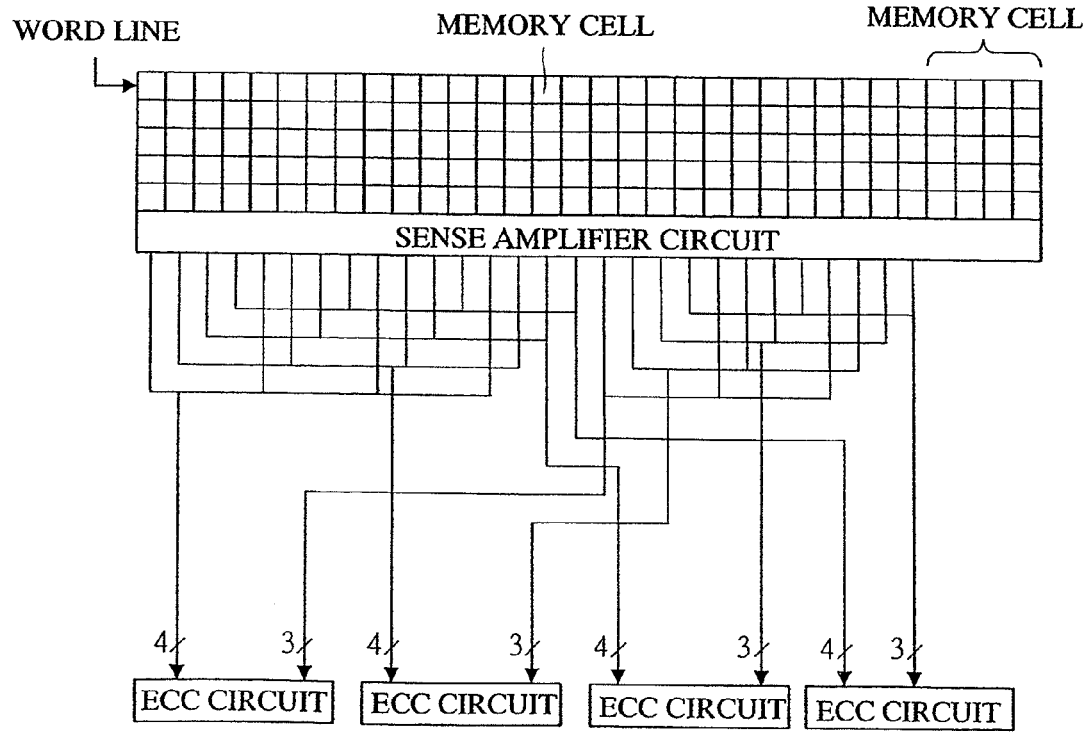
FIG. 21 is a schematic diagram showing an example of the structure of a conventional semiconductor memory device examined prior to the present invention.

FIG. 20 is a schematic diagram showing a modification example of the layout of the error correction code circuits in the structure example shown in FIG. 4. In FIG. 20, only the connection among the memory array ARY, the sense amplifier array SAA, and the error correction code circuit ECC in FIG. 4 will be described. When the error correction ability of the ECC is improved, the circuit structure of ECC is complicated and the circuit area is increased. Therefore, as described above, when ECC is to be mounted to the sense amplifier, the adoption of the error correction system capable of correcting only an error of 1 bit is practical. However, if an error containing several bits occurs due to the influence of a foreign matter caused in the manufacture and the several bits are included in the same ECC, the error correction is impossible.

For its prevention, in the structure example in FIG. 20, each two ECC blocks are formed on the upper and lower sides of the sense amplifiers SA alternately disposed above and below the memory array ARY. By this means, the adjacent four bit line pairs are connected to respectively different error correction code circuits ECC via the sense amplifiers SA. Note that the error correction code circuits ECC_A, ECC_B, ECC_C, and ECC_D are designed to have the longitudinal length equal to that of the sense amplifier array SAA. As described above, by applying the four error correction code circuits ECC to one memory array ARY, the error correction can be performed by the ECC even when a failure occurs in at most adjacent four bit line pairs, and the chip yield in the manufacture can be improved.

In the foregoing, the invention made by the inventors of the present invention has been concretely described based on the embodiments. However, it is needless to say that the present invention is not limited to the foregoing embodiments and various modifications and alterations can be made within the scope of the present invention.

The semiconductor memory device according to the present invention is a technology effectively applied to a DRAM product. However, the present invention is not limited to this, but it can be also applied to an On-chip memory incorporated in a logic chip of a microprocessor and DSP (Digital Signal Processor).

What is claimed is:

1. A semiconductor memory device, comprising:
   a plurality of memory arrays each having a plurality of word lines, a plurality of bit lines, and a plurality of memory cells;
   an input/output buffer section for inputting and outputting data from/to outside;
   a multiplexer section for said input/output buffer section, and
   a plurality of sense amplifier arrays each disposed to correspond to one of said plurality of memory arrays and each of which includes a plurality of sense amplifiers, a local I/O line, and a plurality of read/write ports coupled between the plurality of bit lines and the local I/O line, each sense amplifier being connected to a respective pair of the bit lines of the corresponding memory array,
   wherein at least one corresponding error correction code circuit of a plurality of error correction code circuits is disposed near each said sense amplifier array, each error correction code circuit performing an error correction when an error is present in a part of data read to sense amplifiers of the corresponding sense amplifier array,
   wherein at least one of the plurality of read/write ports is activated to transfer data, which has been error-corrected by at least one of the error correction code circuits and is held in the plurality of sense amplifiers, to the local I/O line,
   wherein said plurality of memory arrays include a plurality of normal memory arrays and a redundant memory array providing a redundant bit for a redundant replacement, wherein said redundant replacement is performed by substituting any one of said plurality of normal memory arrays with said redundant memory array, wherein when said redundant replacement substituting a first memory array of said plurality of normal memory arrays with said redundant memory array is performed, information is read out from memory cells of said redundant memory array instead of from memory cells of said first memory array, and wherein said memory array substitution in said redundant replacement is performed when said multiplexer section selects a connection between said input/output buffer section and said redundant memory array.

2. The semiconductor memory device according to claim 1, further comprising:

a plurality of normal I/O lines used for data input/output to/from said plurality of normal memory arrays; and a redundant I/O line used for data input/output to/from said redundant memory array, wherein said input/output buffer section includes a plurality of input/output buffers and said multiplexer section includes a plurality of multiplexer, and wherein each of said plurality of multiplexers is connected to a corresponding one of said plurality of normal I/O lines and said redundant I/O line.

3. The semiconductor memory device according to claim 1, further comprising:

a plurality of normal I/O lines used for data input/output to/from said plurality of normal memory arrays; and a redundant I/O line used for data input/output to/from said redundant memory array, wherein said input/output buffer section includes a plurality of input/output buffers and said multiplexer section includes a plurality of multiplexer, and wherein an adjacent pair of said plurality of multiplexers are connected to one of said plurality of normal I/O lines, and only one of said plurality of multiplexers is connected to said redundant I/O line.

4. The semiconductor memory device according to claim 1, further comprising:

a plurality of normal I/O lines used for data input/output to/from said plurality of normal memory arrays; and a redundant I/O line used for data input/output to/from said redundant memory array, wherein said plurality of normal I/O lines and said redundant I/O line are connected to said multiplexer section, and the selection of the connection by said multiplexer section is changed in accordance with a clock signal, thereby substituting a part of serial input/output data in accordance with said clock signal for an input/output data of said redundant I/O line.

5. The semiconductor memory device according to claim 1, wherein each said error correction code circuit generates a check bit value of 8 or more bits from a data bit value of 64 or more bits obtained via the corresponding sense amplifier array, and error correction is performed based on said check bit value of 8 or more bits.

6. The semiconductor memory device according to claim 1, wherein at least four error correction code circuits are provided for each of said plurality of memory arrays, and adjacent bit lines included in each of said plurality of memory arrays are connected to different error correction code circuits.

7. The semiconductor memory device according to claim 1, wherein each error correction code circuit includes a plurality of sub-circuits which correspond to the sense amplifiers of the corresponding sense amplifier array in a one-to-one manner, said plurality of sub-circuits are categorized into a plurality of first sub-circuits and a plurality of second sub-circuits, said plurality of first sub-circuits generate a check bit value by using data read to a plurality of sense amplifiers corresponding to said plurality of first sub-circuits in response to an activate command inputted to said semiconductor memory device, and when an error is present, said plurality of first sub-circuits perform a correction to the data read to a sense amplifier corresponding to said error, and said plurality of second sub-circuits determine a presence/absence of an error by comparing, in response to said activate command, the check bit value generated in said plurality of first sub-circuits and a stored check bit value in advance, and transmit results of said determination to said plurality of first sub-circuits, and in response to a pre-charge command inputted to said semiconductor memory device, perform a process for storing a check bit value generated by said plurality of first sub-circuits immediately before said pre-charge command.

8. The semiconductor memory device according to claim 7, wherein each said error correction code circuit utilizes:

a plurality of syndrome prepare signals for generating said check bit value; and a plurality of syndrome signals for determining a sense amplifier corresponding to said error, wherein each said first sub-circuit inputs a number of said syndrome prepare signals and a number of said syndrome signals and data of a bit line connected to a sense amplifier corresponding to that first sub-circuit wherein each said first sub-circuit includes:

an exclusive-OR circuit which performs an exclusive-OR operation between a value indicated by said number of syndrome prepare signals and the data of said bit line so as to reflect a result of said operation onto a value of said number of syndrome prepare signals;

a comparator which generates a detection signal when the value indicated by said number of syndrome signals is a predetermined value; and an inverter which inverts the data of said bit line when the detection signal is generated in said comparator, wherein each said second sub-circuit inputs one of the plurality of syndrome prepare signals and data of a bit line connected to a sense amplifier corresponding to that second sub-circuit, and wherein each said second sub-circuit includes:

a circuit which compares match/mismatch between a check bit value read to the bit line corresponding to that second sub-circuit and a value of one of said syndrome prepare signals in response to said activate command at the time of said determination of the presence/absence of error and then outputs a result of said comparison to one of said syndrome signals; and a circuit which outputs a value of said one syndrome prepare signal to the bit line corresponding to that second sub-circuit when said check bit value is to be stored.

9. The semiconductor memory device according to claim 8, wherein each said second sub-circuit includes:

a latch circuit which retains a value of said one syndrome signal outputted in response to said activate command until said pre-charge command is completed; and an amplifier circuit which amplifies said inputted value of one of said syndrome prepare signals.

10. The semiconductor memory device according to claim 1,
wherein one of said error correction code circuits generates a check bit value of M bits larger than or equal to log 2(N)+2 from a data bit value of N bits obtained via one of said sense amplifier arrays and detects an error of 1 bit in (N+M) bits based on said check bit value.

11. A semiconductor memory device, comprising:
a plurality of memory arrays each having a plurality of word lines, a plurality of bit lines, and a plurality of memory cells, the plurality of memory arrays including a plurality of normal memory arrays and a redundant memory array providing a redundant bit for a redundant replacement performed by substituting any one of said plurality of normal memory arrays with said redundant memory array;
a plurality of sense amplifier arrays each disposed to correspond to one of said plurality of memory arrays and each of which includes a plurality of sense amplifiers connected to said plurality of bit lines;
input/output buffers for inputting and outputting data from/to outside; and
at least one multiplexer for said input/output buffers,
wherein said memory array substitution in said redundant replacement is performed when said at least one multiplexer selects a connection between said input/output buffers and said redundant memory array, and
wherein at least one corresponding error correction code circuit of a plurality of error correction code circuits is disposed near each said sense amplifier array, each error correction code circuit performing an error correction when an error is present in a part of data read to sense amplifiers of the corresponding sense amplifier array.

12. A semiconductor memory device, comprising:
a plurality of memory arrays each having a plurality of word lines, a plurality of bit lines, and a plurality of memory cells; and
a plurality of sense amplifier arrays each disposed to correspond to one of said plurality of memory arrays and each of which includes a plurality of sense amplifiers connected to said plurality of bit lines,
wherein at least one corresponding error correction code circuit of a plurality of error correction code circuits is disposed near each said sense amplifier array, each error correction code circuit performing an error correction when an error is present in a part of data read to sense amplifiers of the corresponding sense amplifier array, and
wherein at least four error correction code circuits are provided for each of said plurality of memory arrays, and adjacent bit lines included in each of said plurality of memory arrays are connected to different error correction code circuits.

13. A semiconductor memory device, comprising:
a plurality of memory arrays each having a plurality of word lines, a plurality of bit lines, and a plurality of memory cells; and
a plurality of sense amplifier arrays each disposed to correspond to one of said plurality of memory arrays and each of which includes a plurality of sense amplifiers connected to said plurality of bit lines,
wherein at least one corresponding error correction code circuit of a plurality of error correction code circuits is disposed near each said sense amplifier array, each error correction code circuit performing an error correction when an error is present in a part of data read to sense amplifiers of the corresponding sense amplifier array, and
wherein each error correction code circuit includes a plurality of sub-circuits which correspond to the sense amplifiers of the corresponding sense amplifier array in a one-to-one manner,
wherein said plurality of sub-circuits are categorized into a plurality of first sub-circuits and a plurality of second sub-circuits,
wherein said plurality of first sub-circuits generate a check bit by using data read to a plurality of sense amplifiers corresponding to said plurality of first sub-circuits in response to an activate command inputted to said semiconductor memory device, and when an error is present, said plurality of first sub-circuits perform a correction to the data read to a sense amplifier corresponding to said error, and
wherein said plurality of second sub-circuits determine a presence/absence of an error by comparing, in response to said activate command, the check bit generated in said plurality of first sub-circuits and a check bit stored in advance, and transmit results of said determination to said plurality of first sub-circuits, and in response to a pre-charge command inputted to said semiconductor memory device, perform a process for storing a check bit value generated by said plurality of first sub-circuits immediately before said pre-charge command.

14. A semiconductor memory device, comprising:
a plurality of memory arrays each having a plurality of word lines, a plurality of bit lines, and a plurality of memory cells; and
a plurality of sense amplifier arrays each disposed to correspond to one of said plurality of memory arrays and each of which includes a plurality of sense amplifiers connected to said plurality of bit lines,
wherein at least one corresponding error correction code circuit of a plurality of error correction code circuits is disposed near each said sense amplifier array, each error correction code circuit performing an error correction when an error is present in a part of data read to sense amplifiers of the corresponding sense amplifier array, and
wherein one of said error correction code circuits generates a check bit of M bits larger than or equal to log 2(N)+2 from a data bit of N bits obtained via one of said sense amplifier arrays and detects an error of 1 bit in (N+M) bits based on said check bit.

* * * * *